(12) United States Patent
Kohl et al.

(10) Patent No.: US 8,455,174 B2
(45) Date of Patent: Jun. 4, 2013

(54) POLYMERS, METHODS OF USE THEREOF, AND METHODS OF DECOMPOSITION THEREOF

(75) Inventors: Paul A. Kohl, Atlanta, GA (US); Sue Ann Bidstrup-Allen, Atlanta, GA (US); Clifford Lee Henderson, Douglasville, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 33 days.

(21) Appl. No.: 12/913,807

(22) Filed: Oct. 28, 2010

(65) Prior Publication Data

US 2011/0136932 A1 Jun. 9, 2011

Related U.S. Application Data

(63) Continuation of application No. 12/140,539, filed on Jun. 17, 2008, now abandoned, which is a continuation of application No. 11/451,144, filed on Jun. 12, 2006, now Pat. No. 7,745,100, which is a continuation of application No. 10/686,697, filed on Oct. 16, 2003, now Pat. No. 7,799,516.

(60) Provisional application No. 60/418,930, filed on Oct. 16, 2002.

(51) Int. Cl.
*G03C 1/00* (2006.01)
*C08F 2/50* (2006.01)

(52) U.S. Cl.
USPC .................. 430/270.1; 522/39; 522/64

(58) Field of Classification Search
USPC ..................... 430/270.1; 522/39, 64
See application file for complete search history.

(56) References Cited

U.S. PATENT DOCUMENTS

| | | |
|---|---|---|
| 4,622,114 A | 11/1986 | Glass et al. |
| 5,167,882 A | 12/1992 | Jacobine et al. |
| 5,525,190 A | 6/1996 | Wojnarowski et al. |
| 6,121,340 A | 9/2000 | Shick et al. |
| 6,399,672 B1 | 6/2002 | Ceska et al. |
| 2004/0076910 A1 | 4/2004 | Rutter, Jr. et al. |
| 2004/0126694 A1 | 7/2004 | Devoe et al. |
| 2004/0137728 A1 | 7/2004 | Gallagher et al. |
| 2004/0146803 A1 | 7/2004 | Kohl et al. |

FOREIGN PATENT DOCUMENTS

| | | |
|---|---|---|
| DE | 10063157 | 7/2002 |
| WO | WO 03/067332 | 8/2003 |
| WO | WO 03/101580 | 12/2003 |

OTHER PUBLICATIONS

Wu et al., "Phooinitiation Systems and Thermal Decomposition Materials", Journal of Applied Polymer Science, vol. 88, pp. 1186-1195, Feb. 18, 2003.*
International Search Report, International Application No. PCT/US03/34198, Dec. 10, 2004.
Supplementary European Search Report, European Patent Application No. EP 03 80 9104, Aug. 23, 2004.
P. Kohl, et.al., Air-Gaps for Electrical Interconnections, Electrochemical and Solid State Lett, vol. 1, p. 49, 1998.

(Continued)

*Primary Examiner* — Cynthia Kelly
*Assistant Examiner* — Connie P Johnson
(74) *Attorney, Agent, or Firm* — Balaram Gupta

(57) ABSTRACT

Polymers, methods of use thereof, and methods of decomposition thereof, are provided. One exemplary polymer, among others, includes, a photodefinable polymer having a sacrificial polymer and a photoinitiator.

3 Claims, 15 Drawing Sheets

STRUCTURE 1

STRUCTURE 2

STRUCTURE 3

STRUCTURE 4

STRUCTURE 5

OTHER PUBLICATIONS

P. Kohl, et.al, Air-Gaps in 0.3 μm Electrical Interconnections, IEEE Electron Device Lett., vol. 21, p. 557, 2000.

H. A. Reed, et.al., Fabrication of Microchannels Using Polycarbonates as Sacrificial Materials, J. Micromech Microeng., vol. 11(6), p. 733, 2001.

D. Bhusari,et.al.,Fabrication of Air-Channel Structures for Microfluidic,Microelectromechanical, and Microelectronic Applications,J. Micromech.Microeng.,vol. 10(3), p. 400,2001.

M. B. Anand, et.al. Use of Gas as Low-K Interlayer Dielectric in LSI's: Demonstration of Feasibility, IEEE, Transactions on Electron Devices, vol. 44, p. 1965, 1997.

C. K. Harnett, et.al., Heat-Depolymerizable Polycarbonates as Electron Beam Patternable Sacrificial Layers for Nanofluidics, J. Vac. Sci, Technol B., vol. 19(6), p. 2842, 2001.

L. S. Loo, et.al., Hot Filament Chemical Vapor Deposition of Polyoxymethylene as a Sacrificial Layer for Fabricating Air Gaps, Electrochemical and Solid State Letters, vol. 4, p. G81, 2001.

H-J. Suh, et.al., Dendritic Material as a Dry-Release Sacrificial Layer, J. Microelectromech. Syst., vol. 9(2), pp. 198-205, 2000.

J. P. Gravesen, et.al., Microfluidics—A Review, J. Macromech. Microeng., vol. 3, p. 168, 1993.

R. F. Service, Microchip Arrays Put DNA on the Spot, Science, vol. 282, 396, 1998.

J. V. Crivello, et.al., A New Class of Photoinitiators for Cationic Polymerization, Macromolecules, vol. 10(6), p. 1307, 1997.

R. Taylor, The Nature of the Transition State in Ester Pyrolysis, Part II. The Relative Rates of Pyrolysis of Ethyl, Isopropyl, and t-Butyl Acetates, Phenylacetates, Benzoate, Phenyl Carbonates, and N-Phenylcarbamates, J. Chem. Soc., Chem. Commun., p. 1025, 1975.

S. Inoue, et.al., Synthesis and Thermal Degradation of Carbon Dioxide-Epoxide Copolymer, Appl. Polym. Symp., vol. 26, p. 2573, 1975.

J.M.J. Frechet, et.al., Design and Synthesis of Novel Allyic and Benzylic Copolycarbonates Susceptible to Aciodolytic or Thermolytic Depolymerization, Makromol. Chem. Rapid Commun., vol. 7, p. 121, 1986.

S. C. Narang, et.al., Chemical Amplification in t-Diol Polycarbonate Resists, Polymer Prepr., (Am. Chem. Soc. Div. Polym. Chem) vol. 26(2),p. 323, 1985.

D. J. Drensbourg, et.al., Bis 2,6-difluorophenoxide Dimeric Complexes of Zinc and Cadmium and their Phosphine Adducts: Lessons Learned Relative to Carbon Dioxide/Cyclohexene Oxide Alternating Copolymerization Processes Catalyzed by Zinc Phenoxides, J. Amer. Chem. Soc., vol. 122, p. 12487, 2000.

M. Murayama, et.al., Anionic Ring-Opening Polymerization of a Cyclic Carbonate Having a Norbornene Structure with Amine Initiators, Macromolecules, vol. 31, p. 919, 1998.

Y. Toba, et.al., Cationic Photopolymerization of Epoxides by Direct and Sensitized Photolysis of Onium Tetrakis (pentafluorophenyl)borate Initiators, Macromolecules, vol. 32(10), p. 3209, 1999.

J. V. Crivello, et.al., Diaryliodonium Salts as Thermal Initiators of Cationic Polymerization, J. Polymer Science, Part A: Polymer Chem., vol. 21, p. 97, 1998.

D. Bhusari, et.al., Fabrication of Air-Channel Structures for Microfluidic, Microelectromechanical, and Microelectronic Applications, J. Microelectromechanical sys., vol. 10(3), p. 400-408, 2001.

X. Wu, et.al., Lithographic Characteristics and Thermal Processing of Photosensitive Sacrificial Materials, Journal of the Electrochemical Society, vol. 149, pp. G555-G561, 2002.

X. Wu, et.al., Photoinitiation Systems and Thermal Decomposition of Photodefinable Sacrificial Materials, Journal of Applied Polymer Science, vol. 88, pp. 1186-1195, 2003.

X. Wu, et.al., Fabrication of Microchannels Using Polynorbornene Photosensitive Sacificial Materials, Journal of the Electrochemical Society, vol. 150(9), pp. H205-H213, 2003.

* cited by examiner

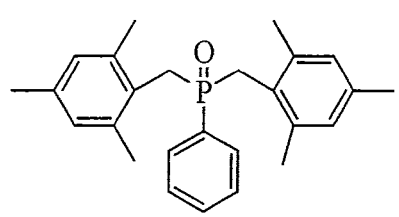
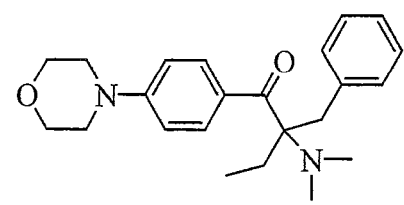
STRUCTURE 1                STRUCTURE 2
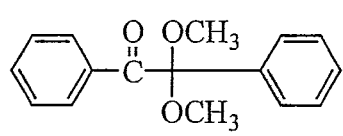
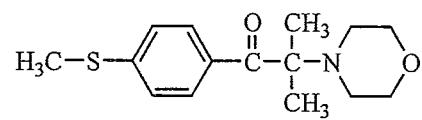
STRUCTURE 3                STRUCTURE 4
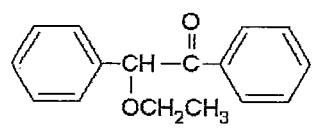
STRUCTURE 5
FIG. 1

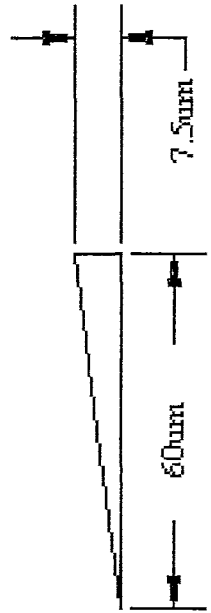
FIG. 4A Rectangular Corner
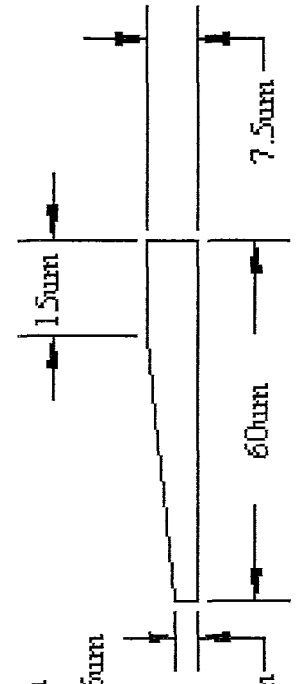
FIG. 4B Triangular Corner
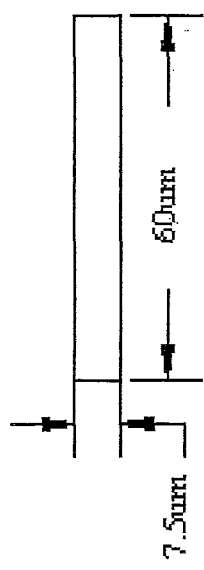
FIG. 4C Fabricated Corner
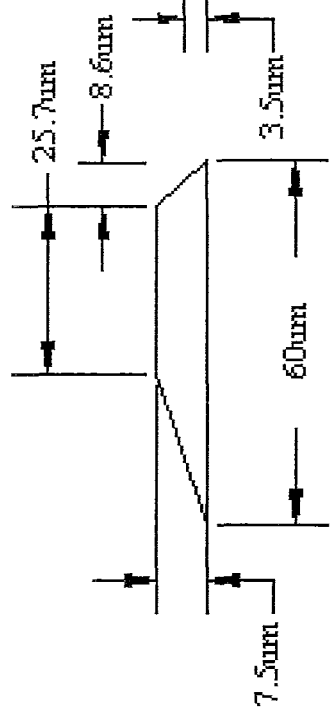
FIG. 4D Best Simulated Corner

POLYMERS, METHODS OF USE THEREOF, AND METHODS OF DECOMPOSITION THEREOF

CROSS-REFERENCE TO RELATED APPLICATIONS

This is a Continuation Application that claims priority to application Ser. No. 12/140,539, filed Jun. 17, 2008, which is a Continuation Application that claims priority to application Ser. No. 11/451,144, filed Jun. 12, 2006, which claims priority to co-pending U.S. application entitled "Polymers, Methods of Use There, and Methods of Decomposition Thereof" having application Ser. No. 10/686,697, filed Oct. 16, 2003, which claims priority to U.S. provisional application entitled "Fabrication of Microchannels using Polynorbornene Photosensitive Sacrificial Materials" having Ser. No. 60/418,930, filed on Oct. 16, 2002, which is entirely incorporated herein by reference.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of MDA awarded by the National Science Foundation (Grant #DMI-9980804) of the U.S. Government.

TECHNICAL FIELD

The present invention is generally related polymers, and, more particularly, is related to photodefinable polymers, methods of use thereof, and methods of decomposition thereof.

BACKGROUND

Microfluidic devices have tremendous potential for applications in a variety of fields including drug discovery, biomedical testing, and chemical synthesis and analysis. In such devices, liquids and gases are manipulated in microchannels with cross-sectional dimensions on the order of tens to hundreds of micrometers. Processing in such microchannel devices offers a number of advantages including low reagent and analyte consumption, highly compact and portable systems, fast processing times, and the potential for disposable systems. However, in spite of all of their promise, microfluidic devices are currently being used in a limited number of applications and are in general still rather simple devices in terms of their operational complexity and capabilities. For example, in terms of making truly portable microanalytical systems, one of the current difficulties involves the simple integration of electronic (e.g., sensing methods) and fluidic elements into the same device. One of the most important issues, which controls this ability to integrate functions into the same device, and thus controls the level of functionality of a microfluidic device is, the method used to fabricate the structure. In addition, fluid microdynamics through the microchannels is important to avoid mixing in systems where mixing is not needed.

The two most prevalent methods for fabricating microfluidic devices to date involve either bonding together layers of ultraflat glass or elastomeric polymers such as poly(dimethylsiloxane). Both methods suffer from severe limitations and difficulties associated with integrating non-fluidic elements such as detectors with the microchannel system in the same substrate. Other methods suffer from several limitations including the fact that they require on the order of ten processing steps to complete the sequence for a single level of microchannels.

SUMMARY OF THE INVENTION

Briefly described, embodiments of this disclosure, among others, include polymers, methods of use thereof, and methods of decomposition thereof. One exemplary polymer, among others, includes a photodefinable polymer having a sacrificial polymer and a photoinitiator.

Methods of for fabricating a structure are also provided. One exemplary method includes, among others: disposing a photodefinable polymer onto a surface, wherein the photodefinable polymer includes a sacrificial polymer and a photoinitiator selected from a negative tone photoinitiator and a positive tone photoinitiator; disposing a gray scale photomask onto the photodefinable polymer, wherein the gray scale photomask encodes an optical density profile defining a three-dimensional structure to be formed from the photodefinable polymer, exposing the photodefinable polymer through the gray scale photomask to optical energy; and removing portions of the photodefinable polymer to form the three-dimensional structure of cross-linked photodefinable polymer.

In addition, methods of decomposing a polymer are also provided. One exemplary method includes, among others: providing a structure having a substrate, an overcoat layer, and a polymer in a defined area within the overcoat layer; maintaining a constant rate of decomposition as a function of time; and removing the polymer from the area to form an air-region in the defined area.

Furthermore, a structure is provided. One exemplary structure includes a substrate; an air-region area having a spatially-varying height; and an overcoat layer disposed onto a portion of the substrate and engaging a substantial portion of the air-region area.

Other systems, methods, features, and advantages will be, or become, apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of this disclosure can be better understood with reference to the following drawings. The components in the drawings are not necessarily to scale, emphasis instead being placed upon clearly illustrating the principles of this disclosure. Moreover, in the drawings, like reference numerals designate corresponding parts throughout the several views.

FIG. 1 illustrates representative embodiments of photoinitiators.

FIGS. 4A through 4D illustrate the cross sections of the four simulated channels. FIG. 4A illustrates the dimensions of a uniform area channel. FIGS. 4B and 4C illustrate channels with tapered corners.

DETAILED DESCRIPTION

Figure 2:
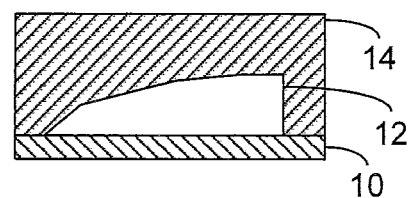
FIG. 2 illustrates a cross-sectional view of a representative structure having an embodiment on an air-region.

In general, polymer, methods of use thereof, structures formed therefrom, and methods of decomposition thereof, are disclosed. Embodiments of the polymer can be used to form photodefinable three-dimensional structures having unique spatial dimensions (e.g., spatially-varying height) using photolithographic techniques. In addition, methods of decomposition can be used to decompose the polymer three-dimensional structure located within a material (e.g., an overcoat layer) without altering (e.g., deforming) the spatial boundaries defined by the photodefinable polymer three-dimensional structure.

Embodiments of the polymer include a photodefinable polymer. The photodefineable polymer includes, but is not limited to, one or more sacrificial polymers and one or more photoinitiators. The photoinitiator can include a negative tone photoinitiator and/or a positive tone photoinitiator.

In general, negative tone photoinitiators can be used making the sacrificial polymer more difficult to remove (e.g., more stable towards a solvent that normally would dissolve the sacrificial polymer). For example, half of a layer of a photodefinable polymer (including a sacrificial polymer and a negative tone photoinitiator) is exposed to optical energy (e.g., ultraviolet (UV) light, near-ultraviolet light, and/or visible light), while the other half is not exposed. Subsequently, the entire layer is exposed to a solvent and the solvent dissolves the layer not exposed to the UV light.

More specifically, the area exposed includes a cross-linked photodefinable polymer, while portions not exposed include an uncross-linked photodefinable polymer. The uncross-linked photodefinable polymer can be removed with the solvent leaving the cross-linked photodefinable polymer (e.g., the photodefinable three-dimensional structure).

Although not intending to be bound by theory, upon exposure to optical energy, one type, among others, of the negative tone photoinitiator can generate free radicals that initiate cross-linking reactions between the sacrificial polymers to form a cross-linked photodefinable polymer. As a result, gray scale lithography can be used to fabricate photodefinable three-dimensional structures from the photodefinable polymer by removing the uncross-linked photodefinable polymer.

In general, positive tone photo initiators can be used making the sacrificial polymer easier to remove (e.g., less stable towards a solvent). For example, half of a layer of a photodefinable polymer (including a sacrificial polymer and a positive tone photoinitiator) is exposed to UV light, while the other half is not exposed. Subsequently, the entire layer is exposed to a solvent and the solvent dissolves the layer exposed to the UV light.

Although not intending to be bound by theory, upon exposure to optical energy, the positive tone photoinitiator generates an acid. Then, upon exposure to a base, the dissolution of the sacrificial polymer is increased relative to sacrificial polymer not exposed to optical energy. As a result, gray scale lithography can be used to fabricate photodefinable three-dimensional structures from the photodefinable polymer by removing the exposed photodefinable polymer.

In general, the photodefinable polymer can be used in areas such as, but not limited to, microelectronics (e.g., microprocessor chips, communication chips, and optoeletronic chips), microfluidics, sensors, analytical devices (e.g., microchromatography), as a sacrificial material to create photodefinable three-dimensional structures that can be subsequently formed into photodefinable air-regions by thermally decomposing the photodefinable polymer. In addition, the photodefinable polymer can be used as an insulator, for example.

For embodiments using the photodefinable polymer as a sacrificial material to create photodefinable air-regions having photodefinable three-dimensional structures, the decomposition of the photodefinable polymer should produce gas molecules small enough to permeate one or more of the materials surrounding the photodefinable polymer (e.g., an overcoat polymer layer). In addition, the photodefinable polymer should slowly decompose so as to not create undue pressure build-up while forming the air-region within the surrounding materials. Furthermore, the photodefinable polymer should have a decomposition temperature less than the decomposition or degradation temperature of the surrounding material. Still further, the photodefinable polymer should have a decomposition temperature above the deposition or curing temperature of an overcoat material but less than the degradation temperature of the components in the structure in which the photodefinable polymer is being used.

The sacrificial polymer can include compounds such as, but not limited to, polynorbornenes, polycarbonates, polyethers, polyesters, functionalized compounds of each, and combinations thereof. The polynorbornene can include, but is not limited to, alkenyl-substituted norbornene (e.g., cycloacrylate norbornene). The polycarbonate can include, but is not limited to, norbornene carbonate, polypropylene carbonate, polyethylene carbonate, polycyclohexene carbonate, and combinations thereof. In addition, the molecular weight of the sacrificial polymer should be between 10,000 and 200,000.

The sacrificial polymer can be from about 1% to 30% by weight of the photodefinable polymer. In particular, the sacrificial polymer can be from about 5% to 15% by weight of the photodefinable polymer.

As mentioned above, the photoinitiator can include negative tone photoinitiators and positive tone photoinitiators. The negative tone photoinitiator can include compounds that generate a reactant that would cause the crosslinking of the sacrificial polymer. The negative tone photoinitiators can include compounds, such as, but not limited to, a photosensitive free radical generator. Alternative negative tone photoinitiators can be used such as photoacid generators (e.g., in an epoxide functionalized systems).

A negative tone photosensitive free radical generator is a compound which, when exposed to light breaks into two or more compounds, at least one of which is a free radical. In particular, the negative tone photoinitiator can include, but is not limited to, bis(2,4,6-trimethylbenzoyl)-phenylphosphineoxide (Structure 1 in FIG. 1) (Irgacure 819, Ciba Specialty Chemicals Inc.), 2-benzyl-2-dimethylamino-1-(4-morpholinophenyl)-butanone-1 (Structure 2 in FIG. 1) (Irgacure 369, Ciba), 2,2-dimethoxy-1,2-diphenylethan-1-one (Structure 3 in FIG. 1) (Irgacure 651, Ciba), 2-methyl-1[4-(methylthio)-phenyl]-2-morpholinopropan-1-one (Structure 4 in FIG. 1) (Irgacure 907, Ciba), benzoin ethyl ether (Structure 5 in FIG. 1) (BEE, Aldrich), 2-methyl-4'-(methylthio)-2-morpholinopropiophenone, 2,2'-dimethoxy-2-phenyl-acetophenone (Irgacure 1300, Ciba), and combinations thereof. In particular, the photoinitiator can include bis(2,4,6-trimethylbenzoyl)-phenylphosphineoxide and 2-benzyl-2-dimethylamino-1-(4-morpholinophenyl)-butanone-1.

The positive tone photoinitiators can include, but are not limited to, photoacid generators. More specifically, the positive tone photoinitiator can include, but is not limited to, nucleophilic halogenides (e.g., diphenyliodonium) and complex metal halide anions (e.g., triphenylsulphonium salts).

The photoinitiator can be from about 0.5% to 5% by weight of the photodefinable polymer. In particular, the photoinitiator can be from about 1% to 3% by weight of the photodefinable polymer.

The remaining percentage of the photodefinable polymer not accounted for in the photoinitiator and sacrificial polymer (e.g., from 65% about to 99%) to can be made up with solvent, such as, but not limited to, mesitylene MS, N-methyl-2-pyrrolidinone, propyleneglycol monomethyl ether acetate, N-butyl acetate diglyme, ethyl 3-ethoxypropionate, and combinations thereof.

Exemplary photodefinable polymers include those shown in Table 1.

TABLE 2

Conditions and results for UV exposure response, with different photoinitiators and the loading of Irgacure 819

| Experiment# | Photoinitiator | Recipe of PNB/PI Solution PNB1/PI/MS (wt %) | Photo-sensitivity (mJ/cm$^2$) | Contrast |
| --- | --- | --- | --- | --- |
| 1 | BEE | 16/0.64/83.36 | 1959 | 0.908 |
| 2 | Irgacure 907 | 16/0.64/83.36 | 3641 | 0.651 |
| 3 | Irgacure 651 | 16/0.64/83.36 | 1054 | 0.907 |
| 4 | Irgacure 369 | 16/0.64/83.36 | 1808 | 0.521 |
| 5 | Irgacure 819 | 16/0.64/83.36 | 134 | 1.213 |
| 6 | Irgacure 819 | 16/0.32/83.68 | 363 | 0.879 |
| 7 | Irgacure 819 | 16/0.16/83.84 | 3236 | 0.448 |

Processing conditions: Spin-coating/2400 rpm, Softbake/110° C., 1 min, PEB/120° C., 30 min, Developer/xylene.

Now having described the photodefinable polymer in general, the following describes exemplar embodiments for using the photodefinable polymer to produce photodefinable three-dimensional structures, where the photodefinable three-dimensional structures can be decomposed to form photodefinable air-regions (e.g., a gas filled region substantially excluding a solid or liquid material or a vacuum-region).

In general, a photodefinable three-dimensional structure can be produced by disposing a layer of the photodefinable polymer onto a substrate and/or layer of material on the substrate. A gray scale photomask is disposed onto the photodefinable polymer or portions thereof that encodes the photodefinable three-dimensional structure, as described below. After exposing the photodefinable polymer through the gray scale photomask to optical energy and removing the unexposed photodefinable polymer (negative tone) or the exposed photodefinable polymer (positive tone), the photodefinable three-dimensional structure is formed.

The gray scale photomask encodes an optical density profile that defines the three-dimensional photodefinable structure. Upon exposure of the gray scale photomask to optical energy, a known amount of optical energy is allowed to pass through portions of the gray scale photomask. The design of the gray scale photomask is used to control the amount of optical energy allowed to pass through the gray scale photomask. In particular, the gray scale photomask can be designed to control the amount of optical energy allowed to pass through the gray scale photomask as a function of the position on the gray scale photomask. Thus, the gray scale photomask can be designed and used to produce the three-dimensional structure from the photodefinable polymer by altering the amount of optical energy allowed to pass through the gray scale photomask as a function of the position on the gray scale photomask. The gray scale photomask can be formed by method known in the art (U.S. Pat. No. 4,622,114).

The three-dimensional structures (and the corresponding photodefinable air-regions) can have cross-sectional areas section such as, but not limited to, non-rectangular cross-sections, asymmetrical cross-sections, curved cross sections, arcuate cross sections, tapered cross sections, cross sections corresponding to an ellipse or segment thereof, cross sections corresponding to a parabola or segment thereof, cross sections corresponding to a hyperbola or segment thereof, and combinations thereof. For example, the three-dimensional structures can include, but are not limited to, non-rectangular structures, non-square structures, curved structures, tapered structures, structures corresponding to an ellipse or segment thereof, structures corresponding to a parabola or segment thereof, structures corresponding to a hyperbola or segment thereof, and combinations thereof. In addition, the three-dimensional structures can have cross-sectional areas having a spatially-varying height.

FIG. 2 is a cross-sectional view of a representative non-rectangular, tapered, and asymmetrical photodefinable air-region 12 having a photodefinable three-dimensional structure. For example, the non-rectangular, tapered, and asymmetrical photodefinable air-region 12 can be used as a corner section in a microfluidic system. This use, as well as others, is described in more detail in Example 1.

As shown in FIG. 2, the non-rectangular, tapered, and asymmetrical photodefinable air-region 12 is positioned on a substrate 10. An overcoat polymer layer 14 is disposed around the non-rectangular, tapered, and asymmetrical photodefinable air-region 12. In another embodiment, among others, the non-rectangular, tapered, and asymmetrical photodefinable air-region 12 can be positioned above the substrate 10 in the overcoat layer 14. In still another embodiment, among others, the multiple non-rectangular, tapered, and asymmetrical photodefinable air-regions and other air-regions can be positioned at multiple heights (e.g., stacked on top of one another or stacked in an offset manner) in the overcoat layer 14.

Although not illustrated, the non-rectangular, tapered, and asymmetrical photodefinable air-region 12 can be formed in conjunction with other air-regions and/or air-channels to form microfluidic devices, sensors, and analytical devices, for example.

The substrate 10 can be used in systems such as, but not limited to, microprocessor chips, microfluidic devices, sensors, analytical devices, and combinations thereof. Thus, the substrate 10 can be made of materials appropriate for the system. However, exemplar materials include, but are not limited to, glasses, silicon, silicon compounds, germanium, germanium compounds, gallium, gallium compounds, indium, indium compounds, or other semiconductor materials and/or compounds. In addition, the substrate 10 can include non-semiconductor substrate materials, including any dielectric material, metals (e.g., copper and aluminum), or ceramics or organic materials found in printed wiring boards, for example.

The overcoat polymer layer 14 can be a modular polymer that includes the characteristic of being permeable or semi-permeable to the decomposition gases produced by the decomposition of a sacrificial polymer while forming the non-rectangular, tapered, and asymmetrical photodefinable air-region 12. In addition, the overcoat polymer layer 14 has elastic properties so as to not rupture or collapse under fabrication and use conditions. Further, the overcoat polymer layer 14 is stable in the temperature range in which the photodefinable polymer decomposes.

Examples of the overcoat polymer layer 14 include compounds such as, for example, polyimides, polynorbornenes, epoxides, polyarylenes ethers, parylenes, inorganic glasses, and combinations thereof. More specifically the overcoat polymer layer 14 includes compounds such as Amoco Ultradel™ 7501, BF Goodrich Avatrel™ Dielectric Polymer, DuPont 2611, DuPont 2734, DuPont 2771, DuPont 2555, silicon dioxide, silicon nitride, and aluminum oxide. The overcoat polymer layer 14 can be deposited onto the substrate 10 using techniques such as, for example, spin coating, doctor-blading, sputtering, lamination, screen or stencil-printing, chemical vapor deposition (CVD), and plasma-based deposition systems.

The non-rectangular, tapered, and asymmetrical photodefinable air-region 12 is formed by the removal (e.g., decomposition) of a crosslinked photodefinable polymer (a negative tone photoinitiator) from a defined non-rectangular, tapered, and asymmetrical area as illustrated in FIG. 2.

It should be noted that additional components could be disposed on and/or within the substrate, the overcoat layer, and/or the non-rectangular, tapered, and asymmetrical photodefinable air-region 12. In addition, the additional components can be included in any structure having air-regions as described herein. The additional components can include, but are not limited to, electronic elements (e.g., switches and sensors), mechanical elements (e.g., gears and motors), electromechanical elements (e.g., movable beams and mirrors), optical elements (e.g., lens, gratings, and mirror), opto-electronic elements, fluidic elements (e.g., chromatograph and channels that can supply a coolant), and combinations thereof.

Although the spatial boundaries of the non-rectangular, tapered, and asymmetrical photodefinable air-region 12 are not easily defined because of the varying lengths, heights, and widths of the air-region, the following spatial boundaries are provided as exemplary lengths, heights, and widths. The non-rectangular, tapered, and asymmetrical photodefinable air-region 12 height can range from about 0.01 to about 100 micrometers. The non-rectangular, tapered, and asymmetrical photodefinable air-region 12 width can be from about 0.01 to about 10,000 micrometers. The non-rectangular, tapered, and asymmetrical photodefinable air-region 12 length can range from 0.01 micrometers about 100 meters. It should be noted that a plurality of air-regions can be formed such that larger and/or more intricate (e.g., multiple curves in the x-, y-, and z-planes) air-regions can be formed.

FIGS. 3A through 3F are cross-sectional views that illustrate a representative process for fabricating the non-rectangular, tapered, and asymmetrical photodefinable air-region 12 illustrated in FIG. 2. It should be noted that for clarity, some portions of the fabrication process are not included in FIGS. 3A through 3F. As such, the following fabrication process is not intended to be an exhaustive list that includes all steps required for fabricating the non-rectangular, tapered, and asymmetrical photodefinable air-region 12. In addition, the fabrication process is flexible because the process steps may be performed in a different order than the order illustrated in FIGS. 3A through 3F or some steps may be performed simultaneously.

Figure 3A:
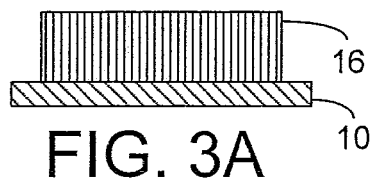
FIGS. 3A through 3F are cross-sectional views that illustrate a representative method of fabricating the structure illustrated in FIG. 2.

FIG. 3A illustrates the substrate 10 having the photodefinable polymer 16 (negative tone) disposed thereon. The photodefinable polymer 16 can be deposited onto the substrate 10 using techniques such as, for example, spin coating, doctor-blading, sputtering, lamination, screen or stencil-printing, melt dispensing, chemical vapor deposition (CVD), and plasma-based deposition systems.

Figure 3D:
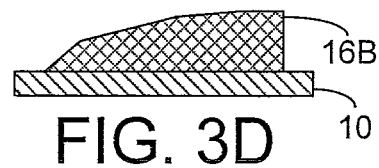
Figure 3B:
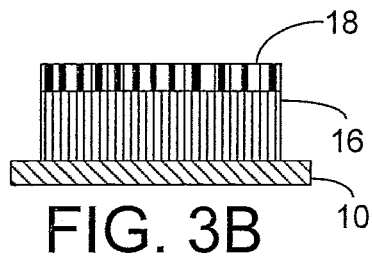

FIG. 3B illustrates a gray scale photomask 18 disposed on the photodefinable polymer 16. The gray scale photomask 18 encodes an optical density profile that defines to the cross-section of the non-rectangular, tapered, and asymmetrical photodefinable air-region 12.

Figure 3E:
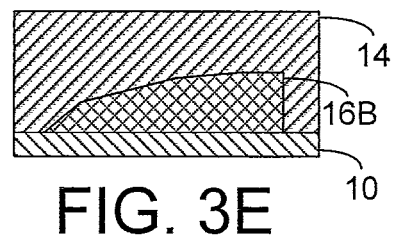
Figure 3C:
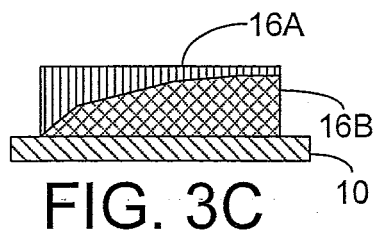

FIG. 3C illustrates the uncross-linked photodefinable polymer region 16A and the cross-linked photodefinable polymer region 16B after exposure of the gray scale photomask 18 to optical energy, while FIG. 3D illustrates the removal of the uncross-linked photodefinable polymer region 16A. The uncross-linked photodefinable polymer region 16A can be removed by dissolution in a liquid, such as a solvent, for example, or by another method that can remove or dissolve the polymer.

FIG. 3E illustrates the formation of the overcoat layer 14 onto the cross-linked photodefinable polymer region 16B. The overcoat layer 14 can be deposited onto the substrate using techniques such as, for example, spin coating, doctor-blading, sputtering, lamination, screen or stencil-printing, melt dispensing, chemical vapor deposition (CVD), and plasma-based deposition systems.

Figure 3F:
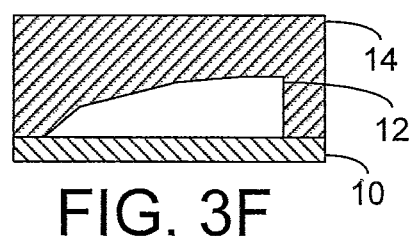

FIG. 3F illustrates the decomposition of the cross-linked photodefinable polymer region 16B to form the non-rectangular, tapered, and asymmetrical photodefinable air-region 12. The cross-linked photodefinable polymer region 16B can be decomposed by heating the cross-linked photodefinable polymer 16B to a temperature sufficient to decompose the polymer (e.g., about 425° C.).

The thermal decomposition the photodefinable polymer (cross-linked photodefinable polymer in FIGS. 3A through 3F) can alter the spatial boundaries or dimensions of the resultant air-region (non-rectangular, tapered, and asymmetrical photodefinable air-region 12 shown in FIG. 2) if the photodefinable polymer decomposes too fast. As discussed in greater detail in Example 1, the thermal decomposition of the photodefinable polymer can cause the air-region to bubble and/or collapse (e.g., sag) in one or more areas of the air-region. Alteration of the spatial boundaries of the cross-section can cause problems for systems where known and designed cross-sections are necessary for the system to function properly.

For example, fluidic systems often need to have a known flow profile to ensure mixing is or is not occurring. If the channels in the fluidic system have regions with unknown cross-sections and/or cross-sections not conforming to the design, the fluid flowing through the channel may have an unknown and an unpredictable flow profile.

Embodiments of this disclosure provide thermal decomposition profiles that substantially eliminate alterations to the spatial boundaries of the air-region caused by the decomposition of the polymer (e.g., sacrificial polymers and photodefinable polymers). Prior solutions included using a constant temperature to decompose the polymer, while others used linear temperature profiles to decompose the polymer. Problems associated with both of these are described in more detail in Example 1.

Embodiments of this disclosure describe decomposing the polymer at a constant rate of decomposition versus time. Thermal decomposition profiles based on maintaining a constant decomposition rate as a function of time can substantially eliminate alterations of the spatial boundaries of the air-region. In other words, the decomposition is performed at a constant rate of mass loss (grams per minute) of the photodefinable polymer.

Thermal decomposition profiles can be expressed by the thermal decomposition profile expression (equation 6 in the following Example).

$$T = \frac{E_a}{R}\left[\ln\frac{A(l-rt)^n}{r}\right]^{-1}$$

where R is the universal gas constant, t is time, n is the overall order of decomposition reaction, r the desired polymer decomposition rate, A is the Arrhenius pre-exponential factor, and $E_a$ is the activation energy of the decomposition reaction. Thus, in order to design a thermal decomposition profile it is helpful to specify four parameters: the three kinetic parameters (A, $E_a$ and n) that describe the polymer decomposition for each polymer, and r the desired polymer decomposition rate. Example 1 describes the thermal decomposition profile expression in greater detail.

It should be noted that not all thermal decomposition profiles produce decomposition of the polymer that do not alter the spatial boundaries of the air-region. Example 1 includes an illustrative polymer where thermal decomposition profiles greater than about 2% decomposition/minute alter the spatial boundaries of the air-region, while thermal decomposition profiles below about 2% decomposition/minute do not alter the spatial boundaries of the air-region. Therefore, one skilled in the art could easily experimentally determine the appropriate thermal decomposition profile through a sequence of experiments without undue experimentation.

One example, among others, for experimentally determining the appropriate thermal decomposition profile includes starting with a 5% decomposition/minute profile. If the spatial boundaries of the air-region are altered, then the thermal decomposition profile can be reduced to a 4% decomposition/minute profile or 2.5% decomposition/minute profile, for example. Alternatively, if the spatial boundaries of the air-region are not altered, then the thermal decomposition profile can be increase by a 1% decomposition/minute profile or more, for example (i.e., form 5% decomposition/minute profile to 6% decomposition/minute profile). In any event, one skilled in the art can use the teachings of this disclosure to obtain an appropriate thermal decomposition profile for numerous desired configurations.

It should also be noted that the thermal decomposition profile could depend upon a variety of factors such as, for example, the materials surrounding the photodefinable polymer, the hardness of the overcoat, and/or the glass transition temperature of the overcoat. Thus, these variables can be considered in the selection of the thermal decomposition profile.

Example 1

The following is a non-limiting illustrative example of an embodiment of this disclosure that is described in more detail in Wu, et al., Journal of the Electrochemical Society, 150, 9, H205-H213 (2003), which is incorporated herein by reference. This example is not intended to limit the scope of any embodiment of this disclosure, but rather is intended to provide specific exemplary conditions and results. Therefore, one skilled in the art would understand that many conditions can be modified to produce a desired result, and it is intended that these modifications be within the scope of the embodiments of this disclosure. In addition, additional details related to this example can be found in Wu, et al., Journal of the Electrochemical Society, 149, 10, G555-G561 (2002) and Wu, et al., J. Appl. Polym. Sci, 81, 5, 1186-1195 (2003), both of which are incorporated herein by reference.

Example 1 describes the development of and demonstrates the use of photodefinable sacrificial polymer fabrication methods to produce channel geometries with non-rectangular, tapered, and asymmetrical shaped cross-sectional profiles. The ability to control the shape of the channel cross-section is expected to be particularly useful in precisely controlling the flow of fluids in microchannel systems, for example. The ability to control fluid flow patterns and dispersion by controlling the channel cross section is investigated herein through computational fluid dynamics simulations. It was found that non-rectangular, tapered, and asymmetrical shaped cross-sectional channel profiles are useful in preserving "plug flow" conditions in curved microchannels, for example, and thus reducing dispersion of components in the flow. Therefore, the thermal decomposition of the photodefinable sacrificial polymers was studied in detail and novel heating protocols were developed that maintain the channel shape during decomposition. The use of these methods demonstrated using gray scale lithography to produce microchannels with tapered cross sections.

Simulation of Flow in Curved Channels

When designing and fabricating microfluidic devices, it is almost inevitable that channels with curved shapes are needed. For example, when designing a long separation column on a chip, turning the channel into a meandering path may be required to keep the device within some required size limits. In such cases, it can be extremely important to precisely control the fluid flow pattern in the channel so as to minimize differences in the residence time distribution of fluid traveling through the channel. In other words, one generally would like to maintain near "plug flow" conditions in devices used for separations, analysis, and other fluidic operations to prevent mixing and loss of spatial confinement of fluid samples after injection or separation. One particular problem is minimizing residence time variations for fluids traveling through corners and curved sections of microfluidic channels. In order to illustrate this point and investigate the improvements that could be realized by using channels with tapered cross sections, a series of computational fluid dynamics simulations were performed.

FLUENT™, a computational fluid dynamics (CFD) simulation package produced by Fluent Inc., was used to simulate the flow in a series of different corner designs for microchannels. GAMBIT™, a preprocessor accessory for FLUENT made by Fluent Inc., was used to construct the desired model geometry, apply the meshing points to the model, and define the required boundary zones. Once defined, FLUENT was used to simulate the flow pattern in each microchannel and to produce numerical and graphical results for each case.

A series of 90 degree turns in microchannels were simulated with varying cross sectional geometries. FIGS. 4A through 4D illustrates the cross sections of the four simulated channels. FIG. 4A illustrates the dimensions of a uniform area channel. FIGS. 4B and 4C illustrate channels with tapered corners. The taper improved the flow around corners with FIG. 4D representing a near optimized design. The inside radius of the turns was held constant at 60 μm and the outside radius of the turns was held constant at 120 μm. The same boundary conditions were applied in simulating the flow through these channels and a constant pressure outlet condition, which was assumed to be atmospheric pressure. In this case, water was used as the flow media, but the results should be general to any Newtonian fluid under laminar flow conditions. Under these conditions, the flow rates and Reynolds numbers are quite low which indicates laminar flow conditions, and thus a laminar flow model was used in FLUENT for solution of these problems.

Figure 5A:
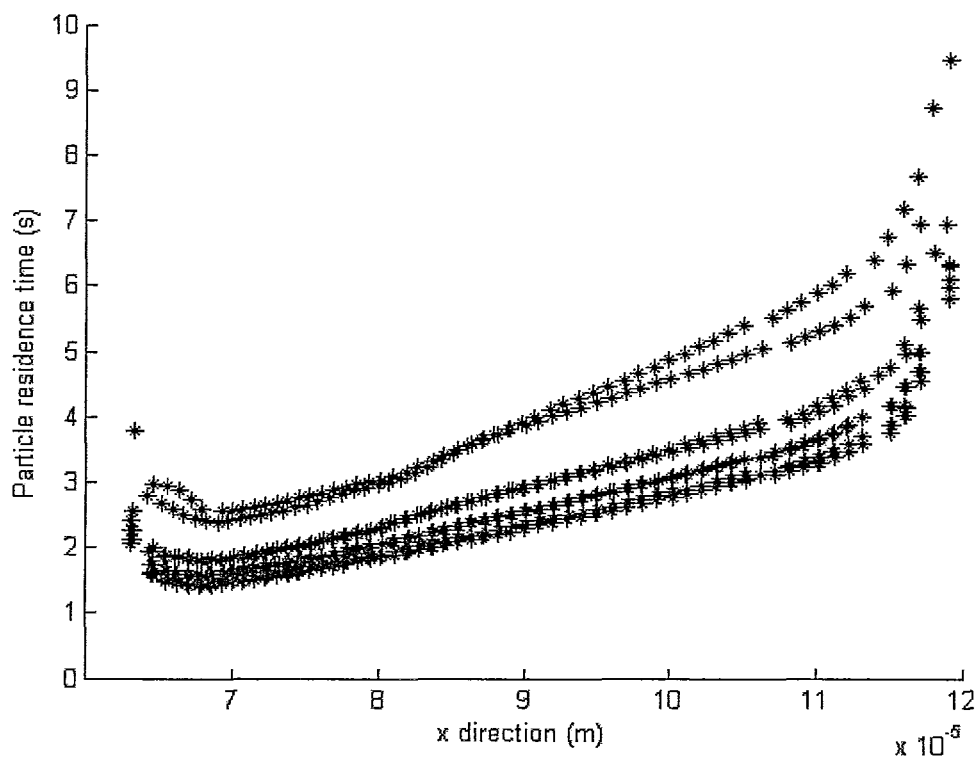
FIGS. 5A through 5C illustrate plots of the transit times for fluid packets as a function of radial distance along the corner for a standard rectangular channel geometry turn, a triangular cross section channel turn, and an improved channel turn in a structure, respectively.
Figure 5B:
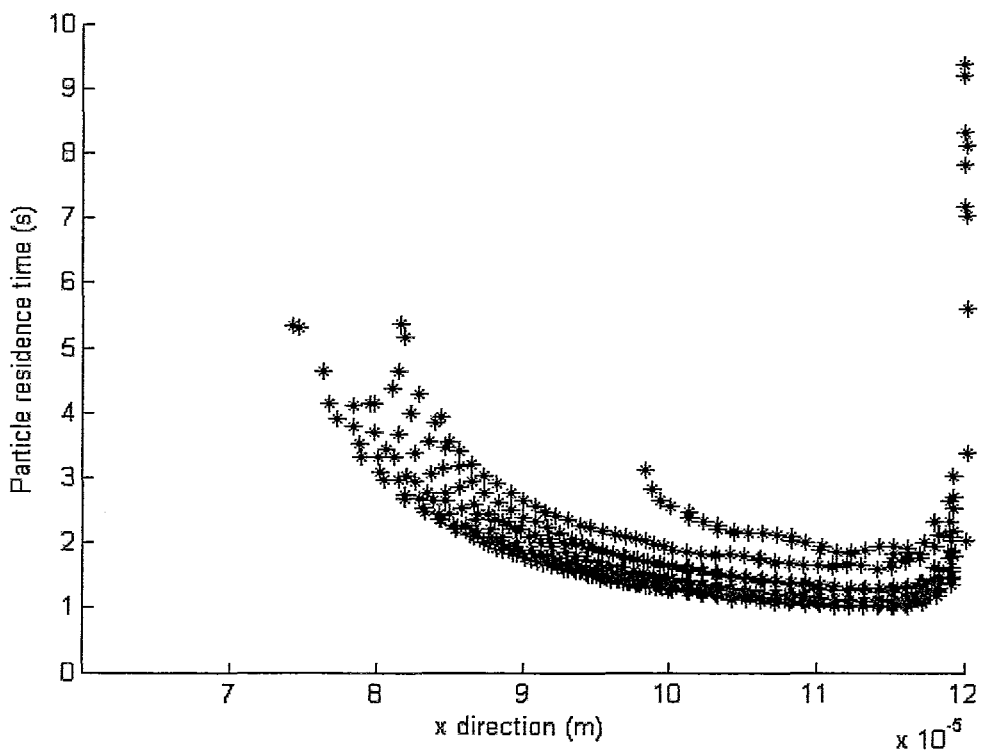
Figure 5C:
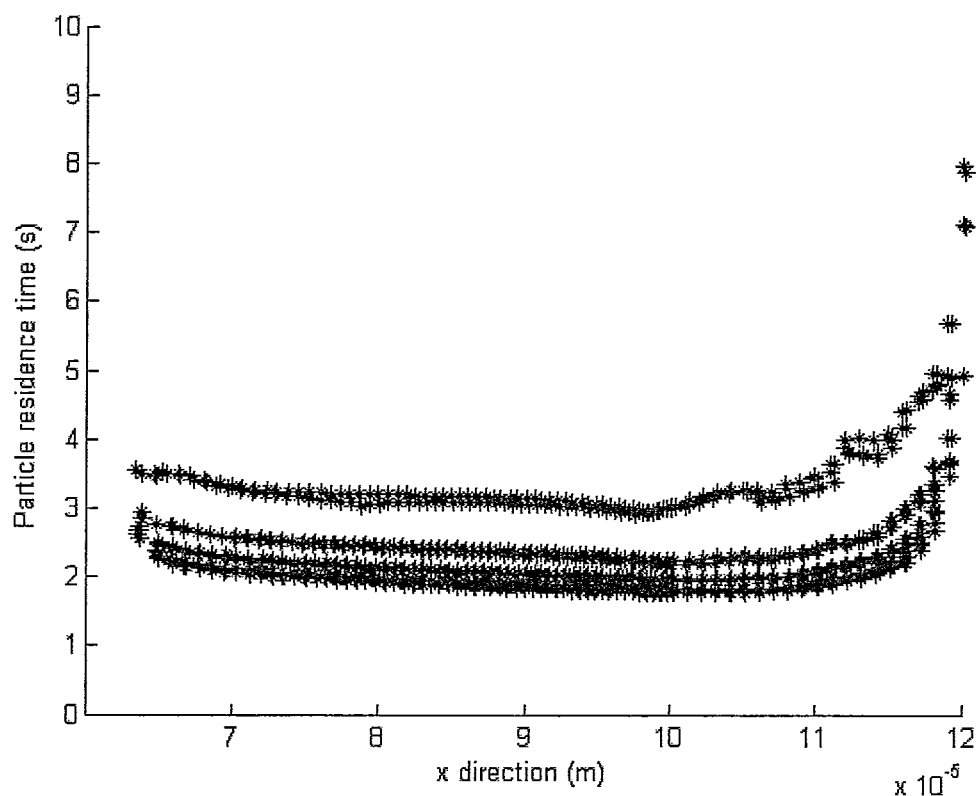

In order to look at the dispersion, which would occur in fluid flowing around each of these microchannel corners, fluid packet trajectories and transit times around each turn were calculated. FIGS. 5A through 5C illustrate plots of the transit times for fluid packets as a function of radial distance along the corner for a standard rectangular channel geometry turn, a triangular cross section channel turn, and an improved channel turn in a structure, respectively. The appearance of different lines of packet transit times on these plots are due to the fact that fluid packets at different vertical positions within the channels also experience slight dispersion due to low velocities near the top and bottom surfaces of the channel.

FIG. 5A illustrates that the standard rectangular channel geometry would result in severe dispersion of an initially flat concentration profile after traveling around the 90 degree turn. Under laminar flow conditions, the relatively uniform velocity profile across the channel cross section coupled with the longer path length for fluid at the outside of the turn result in transit times which are a factor of 3 to 5 larger for fluid at the outside radius as compared to fluid at the inside radius. This dispersion would be even more greatly exaggerated for the case of a 180 degree bend.

One natural solution to this problem is to decrease the velocity of the fluid near the inside radius of the turn in order to achieve equal transit times for the fluid irrespective of radial position. One way to achieve this velocity modification is to alter the cross sectional area of different regions of the channel.

FIG. 5B illustrates the transit time profile for fluid flowing around a turn in a triangular cross section channel. The reduced channel height at the inside radius of the turn would be expected to slow the velocity of fluid along the inside of the turn. Indeed, FIG. 5B shows that the triangular cross section overcompensates and results in longer transit times for fluid near the inside radius as compared to fluid near the outside radius. From close inspection of the FLUENT results, it is also apparent that channel sections that have two walls intersecting at acute angles leads to significant dispersion in these regions, and thus acute angles in the channel cross section geometry should be avoided if possible. Based on these facts, an optimization was performed to design an improved channel cross section profile that would result in minimal dispersion around the simulated turn.

FIG. 5C illustrates the fluid transit time results for such an improved channel structure. The transit time profile is essentially uniform for fluid flowing around a 90 degree corner using this improved shape. Thus, it is clear that by designing the cross-sectional shape of microchannels in turns it should be possible to minimize dispersion in the flow profiles.

Experimental

The sacrificial polymer used was Unity™ 4481P, which includes the copolymer of 5-butyl norbornene (BuNB) and 5-alkenyl norbornene (ANB) in the molar ratio 73/27, (Promerus LLC, Brecksville, Ohio). The polymer weight average molecular weight ($M_w$) and polydispersity index (PDI) were measured to be 425,000 and 3.74, respectively, by gel permeation chromatography using polystyrene calibration standards. Bis(2,4,6-trimethylbenzoyl)-phenylphosphineoxide (Irgacure 819, Ciba Specialty Chemicals Inc.) was used as a free radical photoinitiator (PI). Solutions of polynorbornene (PNB) and PI were prepared using mesitylene (MS, 97%, Aldrich) as the solvent. Two different formulations, PNB/PI/MS in a mole ratio of 16/0.32/84 (2 wt % initiator relative to dry polymer) and PNB/PI/MS in a mole ratio of 16/0.64/84 (4 wt % initiator relative to dry polymer) (weight ratios), were used in the experiments. After exposure and baking, polymer patterns were developed using xylene (98.5+%, Aldrich).

Thermal decomposition characteristics of the sacrificial polymer were investigated using a Seiko Instruments Inc. TG/DTA 320 system. Thermogravimetric analysis (TGA) measurements were performed under $N_2$ at a purge rate of 28 milliliters/minute (mil/min). The encapsulated sacrificial polymer structures were thermally decomposed in a Lindberg tube furnace purged with $N_2$.

For microchannel fabrication, PNB/PI films were cast onto silicon wafers using a Brewer Science CEE 100 spinner and hotplate system. About a 3.5 to 4.0 micrometer (μm) thick PNB/PI film was obtained at a spin speed of 2400 revolutions per minute (rpm) and a softbake of 110° C. for 60 seconds (s). Film thicknesses were measured using a Veeco Dektak profilometer. An OAI Mask Aligner equipped with an i-line filtered UV irradiation source (365 nanometers (nm) wavelength) was used to expose and pattern the PNB/PI films. Before exposure, the intensity of UV light source was measured using an OAI Model 356 Exposure Analyzer with a 365 nm probe. After exposure, samples were post-exposure baked at 120° C. for 30 minutes in an oven. Samples were developed using a continuous spray of xylene while the wafer was spun at 500 rpm.

Removal of any polymer residue from the developed patterns was accomplished using a PlasmaTherm reactive ion etching (RIE) system using the following conditions: 5 standard cubic centimeters per minute (sccm) of $CHF_3$, 45 sccm of $O_2$, 250 milliTorr (mTorr), 300 W, 35° C. The etching rate of the polymer under these conditions is approximately 300 nm/min. Plasma enhanced chemical vapor deposition (PECVD) was performed to deposit a $SiO_2$ overcoat for encapsulation of the polymer channel patterns. The $SiO_2$ was deposited with a PlasmaTherm PECVD using the following conditions: 380 kHz RF frequency, 50 W power, 200° C., 550 mTorr, and a gas mixture of $N_2O$ (1400 sccm) and 2% $SiH_4$ diluted in $N_2$ (400 sccm). The deposition rate for the oxide using these conditions is approximately 50 nm/min.

Thermal Decomposition Program

For the thermal decomposition process, the fractional decomposition can be calculated from the TG curve as shown in equation (1):

$$\alpha = \frac{W_0 - W}{W_0 - W_f} \tag{1}$$

where $W_0$ is the initial mass, W is the mass remaining at some time during the decomposition, and $W_f$ is the final mass of the sample at the end of the thermal cycle. The kinetic description for thermal decomposition of the polymer is generally expressed as shown in equation (2):

$$\frac{d\alpha}{dt} = k(1-\alpha)^n = A\exp\left(-\frac{E_a}{RT}\right)(1-\alpha)^n \tag{2}$$

where n is the overall order of decomposition reaction, A is the Arrhenius pre-exponential factor, and $E_a$ is the activation energy of the decomposition reaction.

In order to avoid a sudden and large release of the gaseous decomposition products from the polymer patterns that may result in distortion of the channel structure, it is desired to keep the decomposition rate $$\left(\frac{d\alpha}{dt}\right)$$

constant during the entire decomposition process. Assuming the decomposition rate is equal to a constant, r, throughout the decomposition process then:

$$\frac{d\alpha}{dt} = r, \text{ and, } t = 0, \alpha = 0 \tag{3}$$

Integrating equation (3) gives the general desired result shown in equation (4):

$$\alpha = rt \tag{4}$$

Assuming that the reaction order, activation energy, and pre-exponential factor do not change significantly during the decomposition, $$\frac{d\alpha}{dt}$$

and α can be replaced with r and rt respectively in equation (2) which results in the following equation:

$$r = A\exp\left(-\frac{E_a}{RT}\right)(1-rt)^n \tag{5}$$

It is now possible to rearrange equation (5) to solve for the necessary temperature versus time profile that is required to maintain a constant rate of polymer decomposition throughout the entire process. The explicit expression for temperature versus time is shown in equation (6).

$$T = \frac{E_a}{R}\left[\ln\frac{A(1-rt)^n}{r}\right]^{-1} \tag{6}$$

Thus, in order to design a heating profile it is necessary to specify four parameters: the three kinetic parameters (A, $E_a$ and n) that describe the polymer decomposition, and r the desired polymer decomposition rate. Based on regression of TGA data performed in previous experiments, the kinetic parameters for the polymer used here were determined to be: $A=5.8\times10^{14}$ min$^{-1}$, $E_a=207$ kJ/mol and n=1.05. Thus, for a given constant decomposition rate, r, one can obtain a curve of temperature versus decomposition time.

Results and Discussion

Decomposition Condition: Thermal decomposition of the photodefinable sacrificial polymer was performed in a pure nitrogen atmosphere in order to avoid any oxidation of the polymer that could result in the formation of non-volatile decomposition products and undesirable residue in the microchannels. In addition to using an inert atmosphere, as suggested previously a controlled heating profile was used to maintain a relatively constant polymer decomposition rate. This constant decomposition rate ensures that gaseous products are not released at such a rate that high pressures are generated that significantly deform the channel shape.

Figure 6:
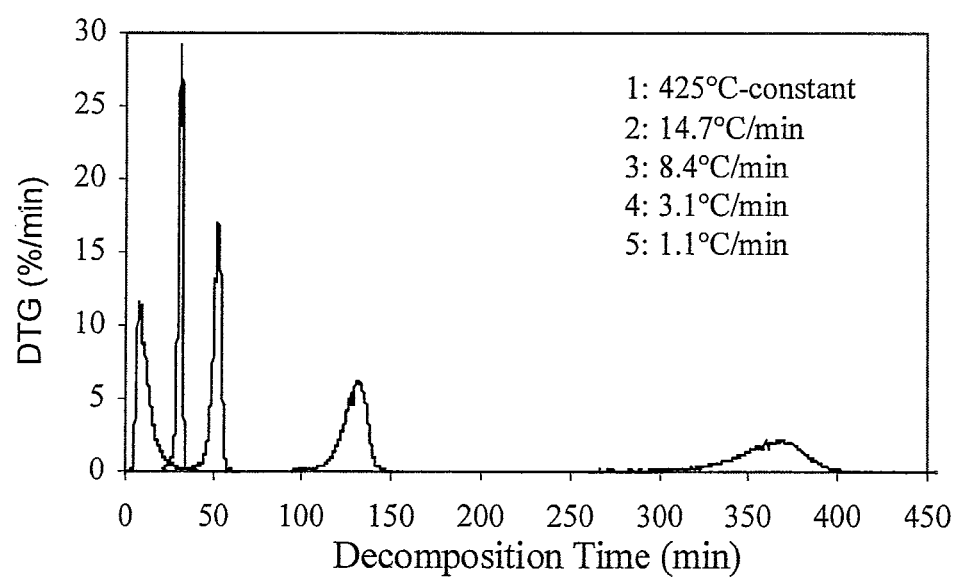
FIG. 6 illustrates curves of the decomposition rate versus time for pure polynorbornene (PNB) samples decomposed at both a constant temperature of 425° C. (isothermal decomposition) and various heating rates (dynamic decomposition), respectively.

FIG. 6 illustrates curves of the decomposition rate versus time for pure PNB samples decomposed at both a constant temperature of about 425° C. (isothermal decomposition) and various heating rates (dynamic decomposition), respectively. In each case, there is a peak in the decomposition rate. The width of the peak corresponds to the transition period during the conversion of sacrificial polymer to gaseous products. Higher heating rates or higher temperature isothermal decompositions result in a sharp peak in the decomposition rate profile. This implies that the majority of the decomposition process occurs over a short time interval, thus resulting in a sudden and large release of the gaseous decomposition products. It was therefore expected that controlling the decomposition rate at a constant low level using controlled heating profiles could eliminate this phenomena, and thus prevent channel distortion during decomposition. It was decided to test this theory by comparing the effect of various decomposition procedures on the final resulting microchannel shapes and sizes.

Figure 7:
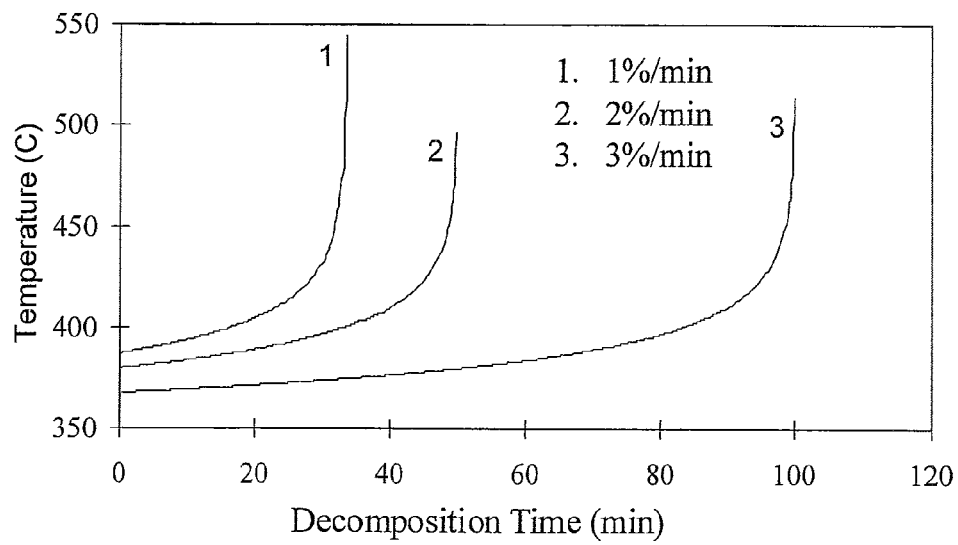
FIG. 7 illustrates the temperature versus time heating profiles required to achieve decomposition rates of 1, 2, and 3% per minute using equation (6) in Example 1.

Based on equation (6), the temperature versus time heating profiles required to achieve decomposition rates of 1, 2, and 3% per minute were calculated and are illustrated in FIG. 7. The figure illustrates that, at a constant decomposition rate, the decomposition temperature during most of decomposition time should be set to a relatively low temperature, with a slight ramp rate. However as the decomposition nears completion, higher temperatures can be used which helps obtain complete decomposition of the polymer within a reasonable time.

Figure 8:
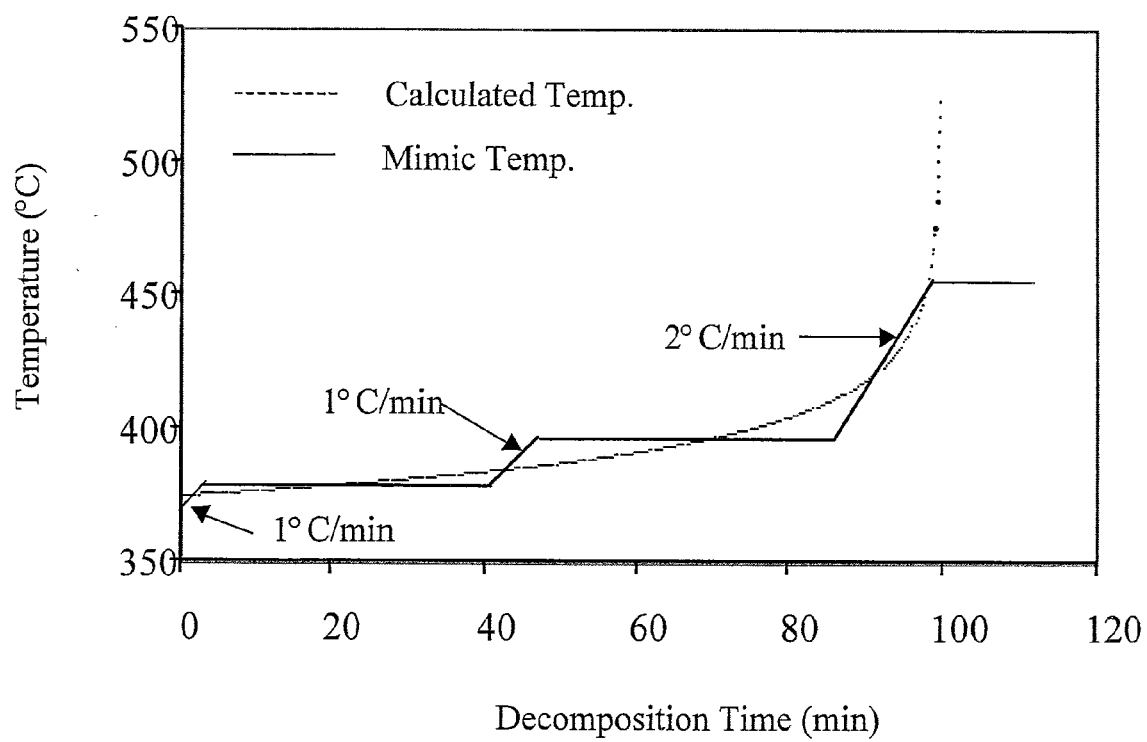
FIG. 8 illustrates the temperature versus time curve calculated using equation (6) and the corresponding simple mimic heating profile that was tested in the Lindberg decomposition furnaces for device fabrication.
Figure 9:
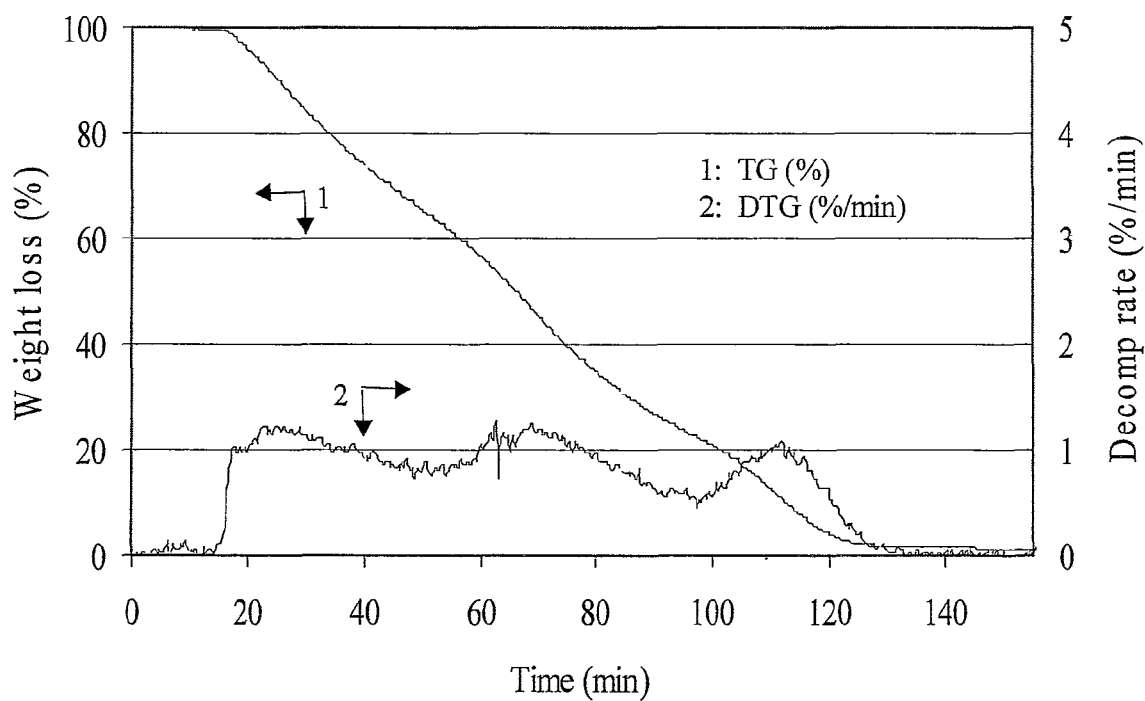
FIG. 9 illustrates thermogravimetric analysis (TGA) results for the simple mimic heating program that was designed to achieve a 1% per minute decomposition rate.

Representative temperature profiles that closely approximate the smooth temperature versus time curves produced via equation (6) were used to perform the decompositions. FIG. 8 illustrates the temperature versus time curve calculated using equation (6) and the corresponding simple mimic heating profile that was tested in the Lindberg decomposition furnaces for device fabrication. FIG. 9 illustrates TGA results for the simple mimic heating program that was designed to achieve a 1%/minute decomposition rate. The DTG curve demonstrates that the decomposition rate does indeed fluctuate closely around the desired 1%/minute level without extreme variations. Thus, the sharp peak in the decomposition rate shown in FIG. 6 can be avoided by using more intelligent heating profiles (a non-linear heating profile as a function of time). When this same mimic heating profile is used in processing encapsulated polymer samples, no distortion in the encapsulated channels was observed but electron microscopy revealed that small amounts of polymer residue were left in the channel structures. Two different modifications to the mimic heating profile were tested in an attempt to remove this residual polymer. In the first case, a final hold at 455° C. for one hour was used in an attempt to remove the residual polymer. This high temperature hold did indeed reduce the residual remaining polymer substantially as observed in SEM cross sections, but some remaining residue was left even after the one hour hold. A second method that involved doubling the intermediate holds shown in FIG. 8 was also tested. This effectively reduced the average decomposition rate even further, to somewhere approaching the 0.5%/minute level. In this case, it was observed that no distortion of the channel profile occurred during the decomposition and essentially no polymer residue was found in the microchannel after decomposition. This suggests that there may be additional byproducts formed during the decomposition if the process is ramped too quickly. This results in a residue that can be difficult to remove, even with high temperature processing. Longer holds at lower temperatures can be used to both slow the decomposition rate (and thus reduce pattern profile distortion) and to eliminate residual polymer in the final channel structures.

Microchannels encapsulated with polyimide and $SiO_2$: Microchannels have been made following the scheme in FIG. 3A through 3F. In the processing, about 3.5 to 4.0 µm thick PNB/PI film (4 wt % initiator in PNB) was cast using a spin speed of 2400 rpm and softbake condition of 110° C./60 seconds. The film was exposed to UV light using a chrome on quartz mask with dose of 450 mJ/cm$^2$ and post-exposure baked at 120° C. for 30 minutes in an oven. After post-exposure baking, the film was spray-developed using xylene to produce the desired channel patterns. There was no noticeable residue remaining after development in the patterned areas, but direct overcoating of the encapsulant material on the as-developed features resulted in poor adhesion to the substrate. In fact, small bubbles were observed in the overcoat materials in the areas where the sacrificial polymer was presumably developed cleanly away from the substrate. Therefore, it is possible that some small amount of polymer residue remains after development that prevents good adhesion of the overcoat to the substrate.

In order to avoid this phenomenon, a residue removal treatment was employed by dry-etching in an oxygen plasma using an RIE before the channel patterns are encapsulated. After residue removal using the plasma, samples were then encapsulated using either polyimide or $SiO_2$. Polyimides are good materials for encapsulation because they display high glass transition temperatures and thermal stability, low dielectric constant, modulus, moisture adsorption and stress. Here, HD Microsystems PI 2734 polyimide, was used to overcoat some of the channel structures. In these cases, the PI 2734 was spin-coated on the top of the channel patterns at a speed of 2300 rpm for 30 sec, and cured at 350° C. for 1 hr under $N_2$. The thickness of the polyimide layer under these conditions is approximately 4.5 µm. In addition, some channel structures were encapsulated using $SiO_2$. In these cases, a 2-µm thick encapsulation layer of $SiO_2$ was deposited using the PECVD recipe described earlier.

Figure 10A:
FIGS. 10A through 10G illustrate scanning electron microscope (SEM) images of the channel encapsulated with polyimide and decomposed at different rates using different heating profiles.
Figure 10B:
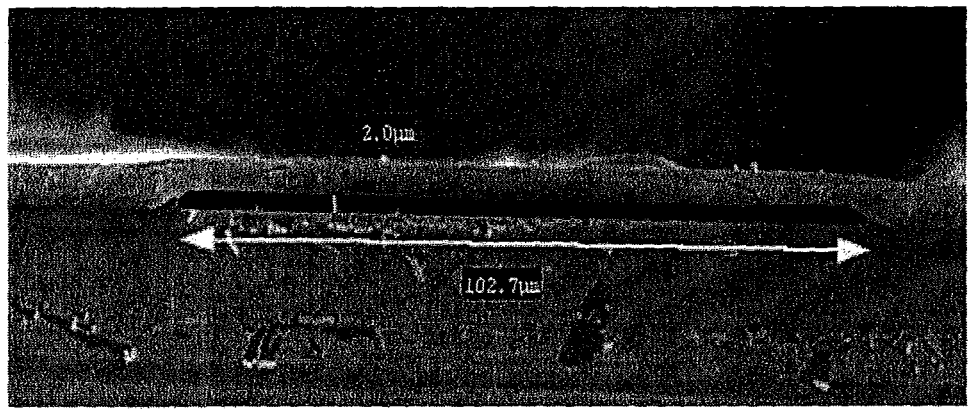
Figure 10C:
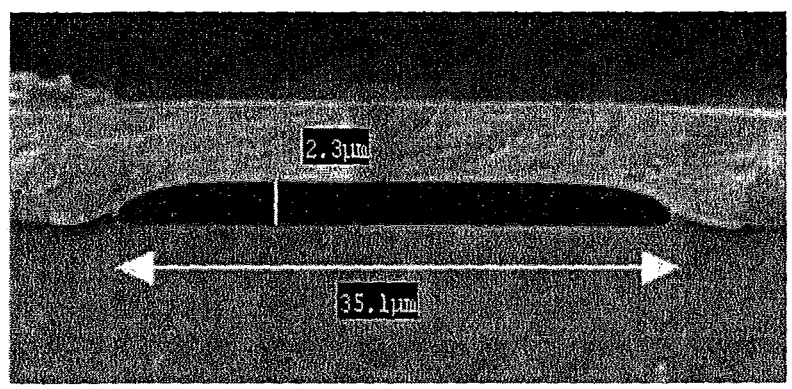
Figure 10D:
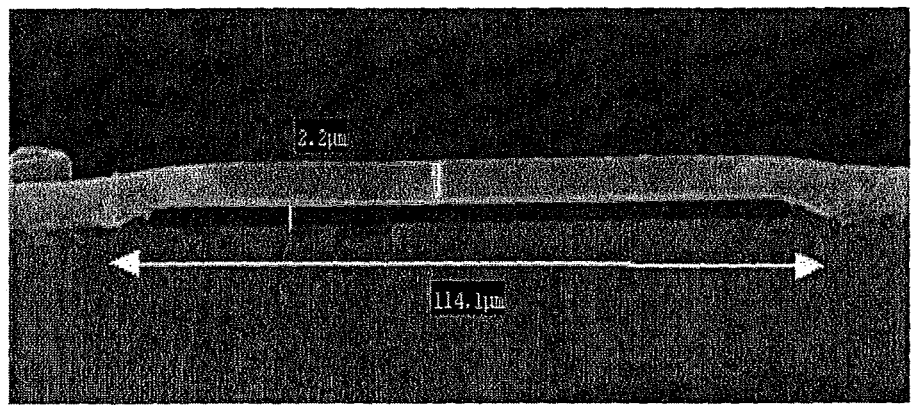
Figure 10E:
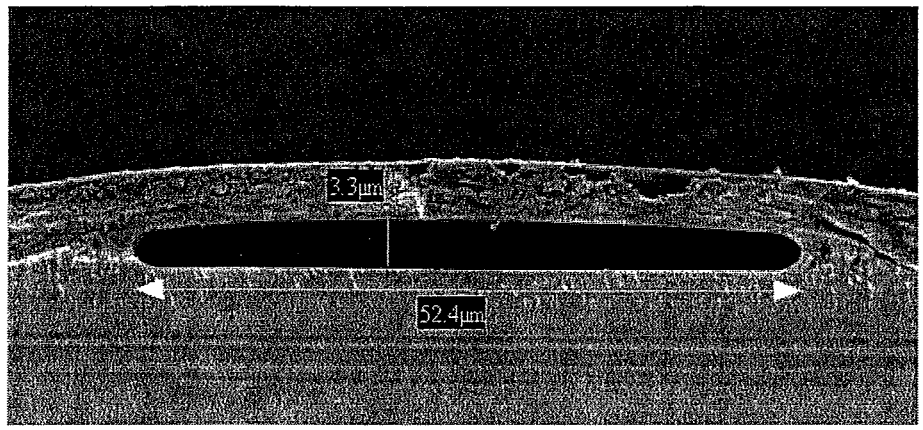
Figure 10F:
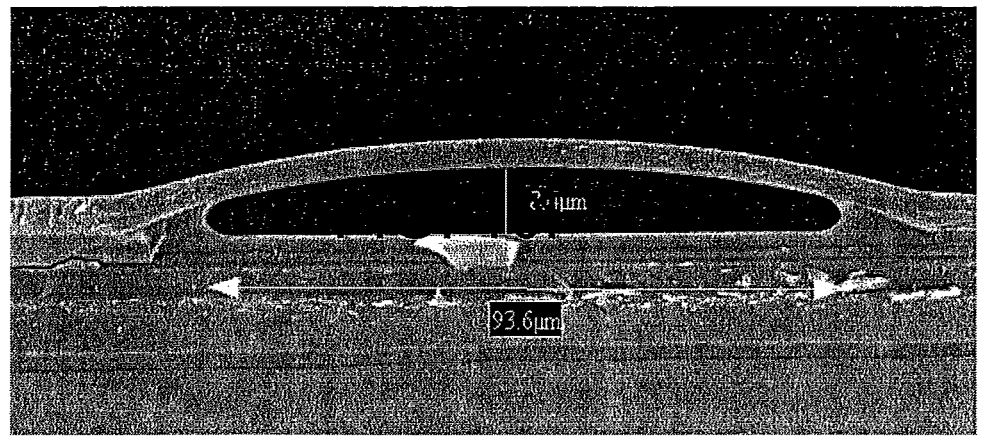
Figure 10G:
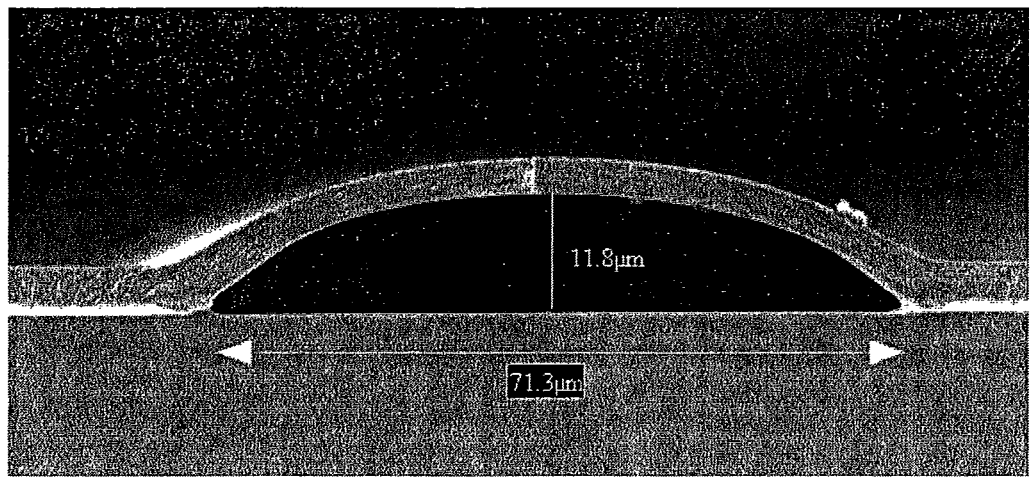
Figure 11A:
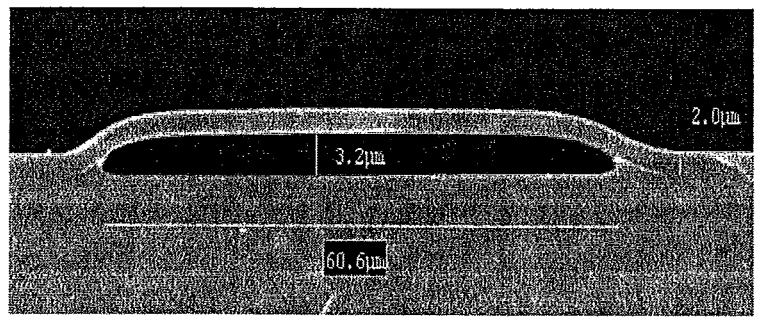
FIGS. 11A through 11F illustrate SEM images of channels encapsulated with $SiO_2$.
Figure 11B:
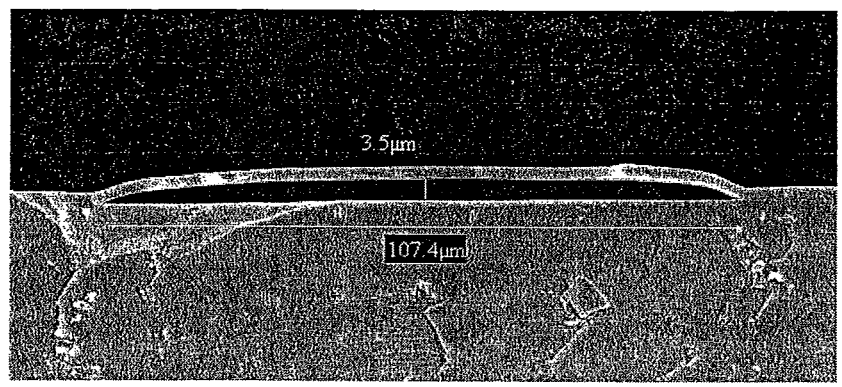
Figure 11C:
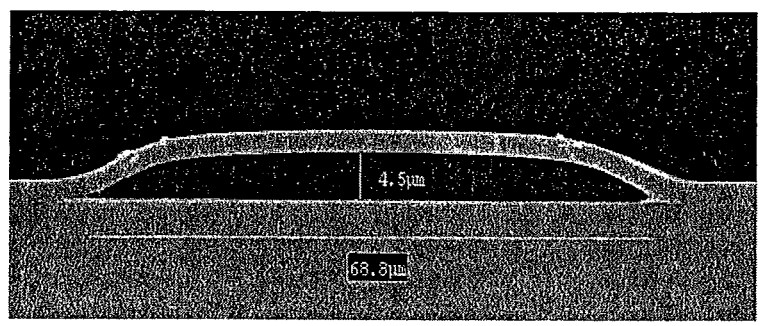
Figure 11D:
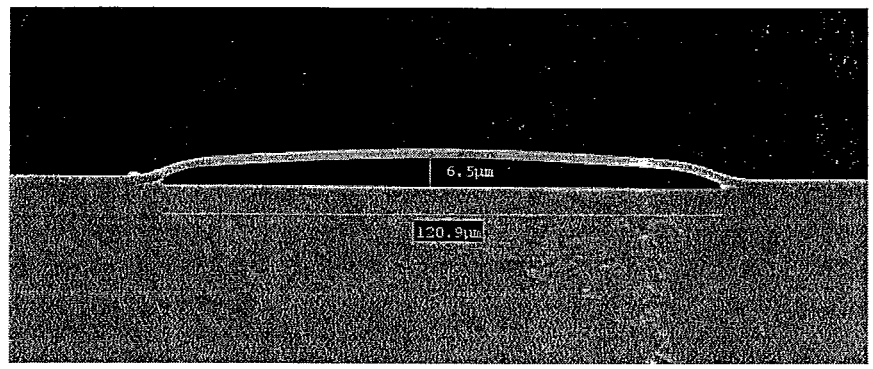
Figure 11E:
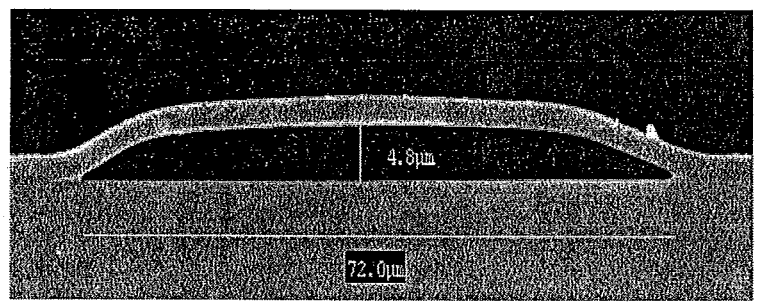
Figure 11F:
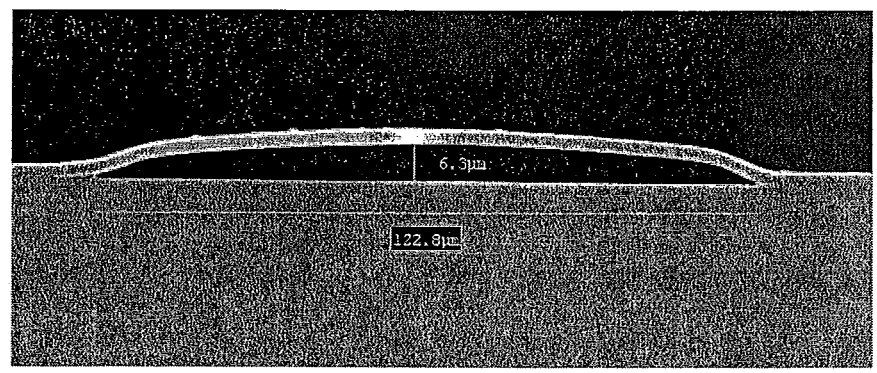

The decomposition of the encapsulated polymer patterns was performed at various decomposition rates to investigate the effect of the rate on the channel structure. FIG. 10A through 10B illustrate SEM images of the channel encapsulated with polyimide and decomposed at different rates using different heating profiles. The results indicate that the decomposition rate does indeed affect the channel structure significantly. At low decomposition rates (1 or 2%/minute), the channel structures produced maintain the size and shape of the original PNB sacrificial polymer pattern. However, at relatively high decomposition rates (3%/min) or when a high constant temperature decomposition process is used, the microchannels are distorted into dome- or arc-shaped profiles. It is also obvious that this distortion problem becomes a more important issue for microchannels as their lateral size increases. Channels with larger widths clearly deformed more than channels of smaller dimensions. SEM images of channels encapsulated with $SiO_2$ are shown in FIGS. 11A through 11F. It was observed that the extent of channel deformation appears to be higher in the $SiO_2$ overcoated structures as compared to the polyimide overcoated channels at the same nominal channel feature sizes and polymer decomposition rates. This larger deformation in the $SiO_2$ overcoated samples could be due to both differences in the mechanical properties of the two overcoat materials and differences in the diffusion rate of the decomposition products through the overcoat materials.

Microchannels with tapered cross-section structure: In order to fabricate the tapered microchannel structures, the concept described here is to use a lithography process employing a gray-scale photomask and a low contrast photosensitive sacrificial material. A series of experiments was performed to investigate the possibility of using such an approach for producing microchannels that are shaped in a controlled manner in all three dimensions.

Channel features were designed with an approximately linear gradient in percent transmission across the width of the channel with varying ratios of chrome stripes to clear, transparent area. In this particular case, the chrome stripe features were designed to be 200 nm in size and thus served as sub-resolution features for the photosensitive sacrificial polymers used in this work. Two masks were fabricated from these designs by electron beam lithography at ETEC Systems (Hayward, Calif.). Table 2 describes the two main channel features used in this work in more detail. Using this type of gray-scale mask allows for the photosensitive sacrificial material to be exposed to a range of doses across the width of the channel feature using a single lithographic exposure step. This exposure gradient in conjunction with a low contrast resist material can be used to produce a feature that is shaped in both the lateral and vertical directions with respect to the plane of the substrate in a single lithographic process.

Figure 12:
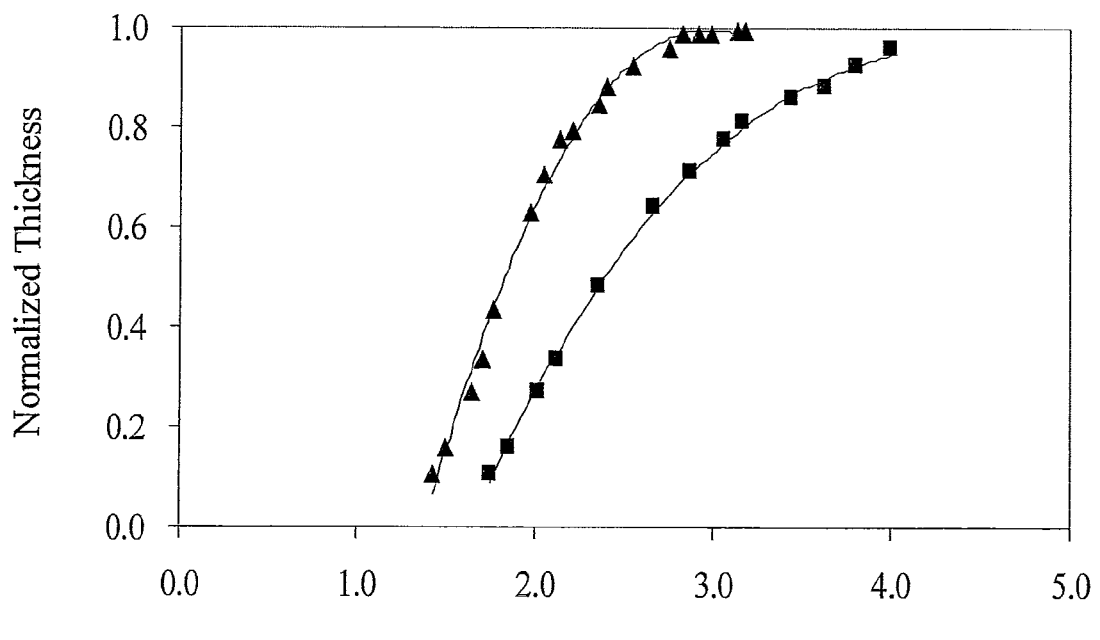
FIG. 12 illustrates the contrast curves for two photosensitive polymer formulations used in Example 1.

Two photosensitive materials with different contrast levels were used to generate tapered microchannel structures with this mask. FIG. 12 illustrates the contrast curves for the two photosensitive sacrificial polymer formulations used in this work. The methods of measuring contrast curves and calculating contrast values for these materials have been discussed previously in the literature. The contrast factors for these two systems are a modest 0.51 and 0.85 for the 2 wt % (referred to as "material 1") and 4 wt % (referred to as "material 2") photoinitiator relative to dry polymer loadings, respectively.

TABLE 2

Characteristics of the gray-scale microchannel photomask

Feature I

| | |
|---|---|
| Channel Width | 60 μm |
| Zone Size: | 6 μm 6 μm 6 μm . . . 6 μm 6 μm 6 μm |
| Transparency (TP): | 100% 90% 80% . . . 30% 20% 10% |

Feature II

| | |
|---|---|
| Channel Width | 80 μm |
| Zone Size: | 4 μm 4 μm 4 μm . . . 4 μm 4 μm 4 μm |
| Transparency (TP): | 100% 95% 90% . . . 15% 10% 5% |

Using this contrast curve data, it is possible to calculate a rough prediction of the pattern profile that will result from exposure using a gray-scale mask with these photosensitive materials if the relative transparency as a function of position on the mask is known accurately. Based on polynomial fitting, the contrast curves can be adequately described using the following functions:

$$f_1 = 0.0236[\log(D)]^3 - 0.357[\log(D)]^2 + 1.818[\log(D)] - 2.13 \quad (7)$$

$$f_2 = 0.0352[\log(D)]^3 - 0.653[\log(D)]^2 + 2.95[\log(D)] - 2.92 \quad (8)$$

Here $f_i$ is the fraction of the film thickness remaining after exposure to a dose D and wet development for material i.

An approximate shape of the channel patterns that will be produced from a gray-scale mask can thus be predicted using Eq. 9, $$d(x) = f_i(\log[D \cdot TP(x)]) \cdot FT \quad (9)$$

where, $f_i$ is the contrast function for material i, d(x) is the thickness of the film (after development) at a certain position x across the channel pattern, TP(x) is the fractional transparency of the mask at the position x across the feature, D is the nominal exposure dose used, and FT is the original thickness of the cast film. The outline of the simulated channel pattern include the points calculated by Eq. 9, which were then smoothed by seven-point smoothing, Eq. 10.

$$S_i = \frac{Y_{i-3} + 2Y_{i-2} + 3Y_{i-1} + 4Y_i + 3Y_{i+1} + 2Y_{i+2} + Y_{i+3}}{16} \quad (10)$$

where $S_i$ and $Y_i$ are the smoothed signal and original signal for the $i^{th}$ point respectively.

Tapered-structure channel patterns were fabricated using the gray-scale lithographic approach using a sequence of steps similar to those outlined in FIGS. 3A through 3F. First, 12-μm thick PNB/PI films were cast using a spin speed of 700 rpm and softbake condition of 110° C. for 2 minutes. The films were then exposed to UV light with the gray-scale mask. The nominal exposure dose was set using the contrast curve data for the photosensitive material to obtain a film with 80% original thickness remaining after development under a 100% transparent feature. The doses used were 1300 mJ/cm² and 165 mJ/cm² for 2 wt % and 4 wt % initiator loadings, respectively. The films were post-exposure baked at 120° C. for 30 minutes in oven. The films were spray developed using xylene at a spin speed of 500 rpm for 30 seconds. The final shape of the microchannel patterns was measured using profilometry.

Figure 13:
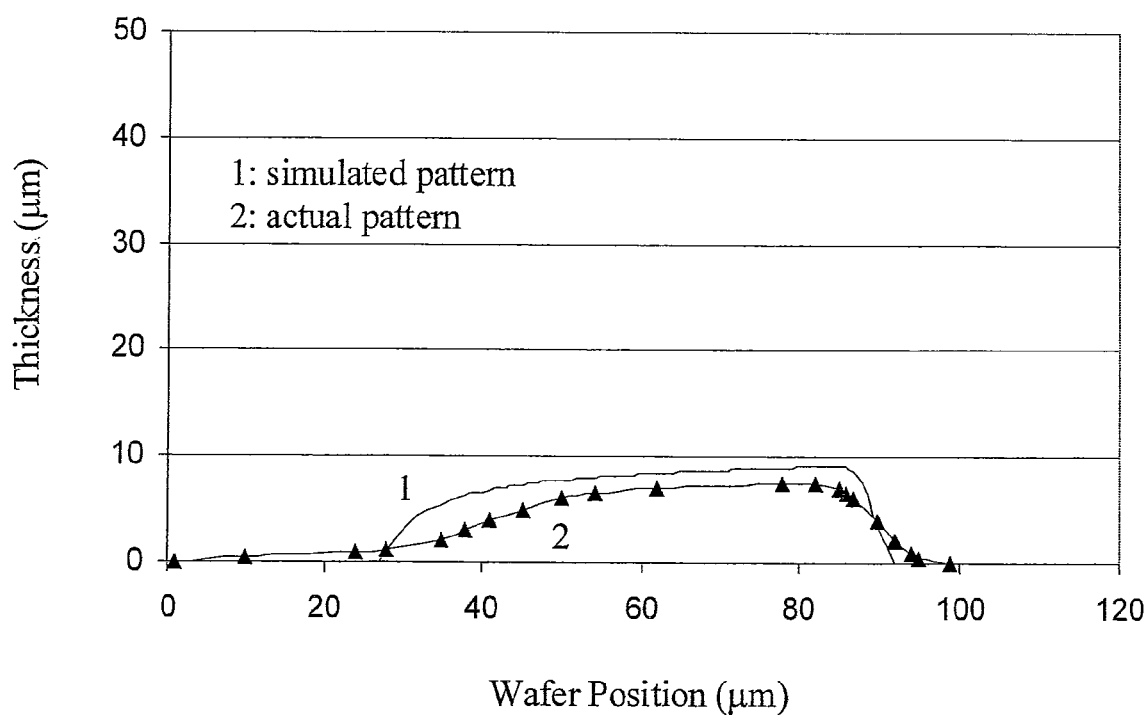
FIGS. 13 and 14 illustrate the real Feature I type PNB patterns produced as measured by profilometry, and for comparison the predicted microchannel patterns (using equations 7 through 10 in Example 1), for the systems with 2 wt % and 4 wt % initiator loadings.
Figure 14:
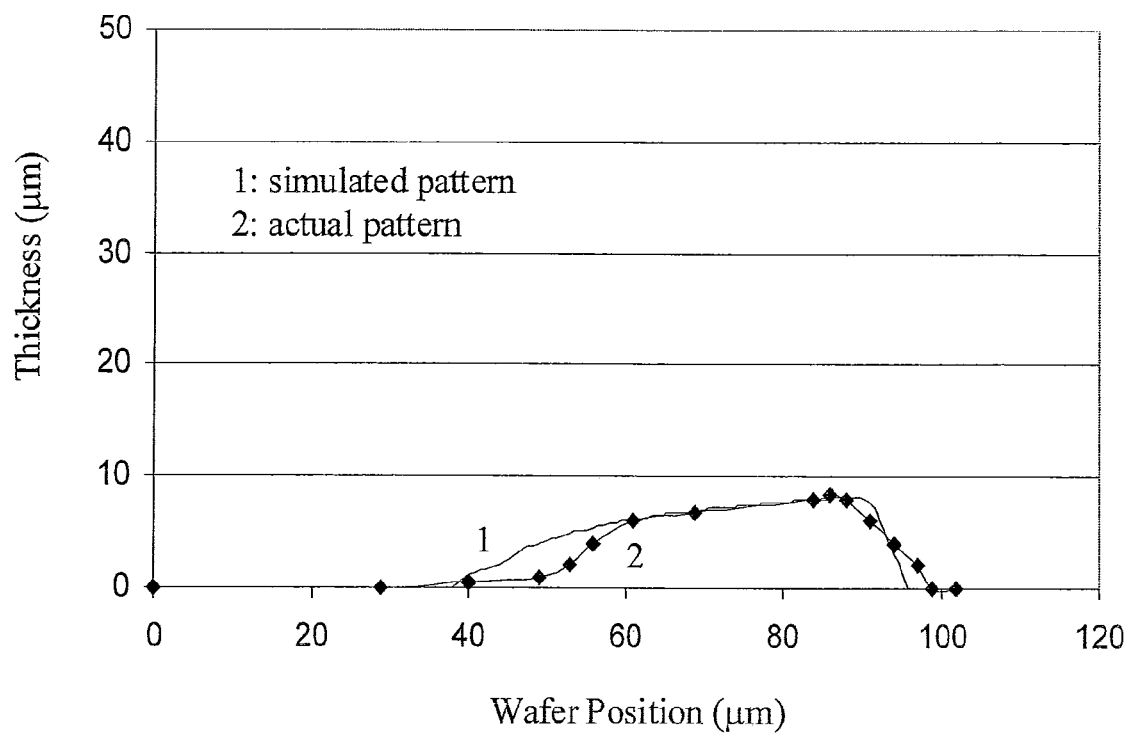

FIGS. 13 and 14 illustrate the real Feature I type PNB patterns produced as measured by profilometry, and for comparison the predicted microchannel patterns (using equations 7 through 10), for the systems with 2 wt % and 4 wt % initiator loadings. A comparison between different patterns produced by the two formulations clearly shows that the material with the lower contrast produces a profile that more closely resembles the desired smoothly tapered structure. However, it can be seen that the simple prediction of the profile shape only roughly approximates the actual feature produced using this method. Upon closer inspection of the mask, it was apparent that the desired smooth gradient in transmission was not faithfully reproduced into the mask due to the extremely small feature sizes used for the constituent patterns. This brings up the issue that accurate gray scale mask production for such a method may in fact be a challenging task. In any case, with more careful attention and accurate transfer of the design to the mask, it should be possible to use the contrast data for a material in conjunction with equations (7) through (10) to design a gray-scale mask feature for a specific photosensitive material that can be used to obtain any desired pattern shape.

Figure 15A:
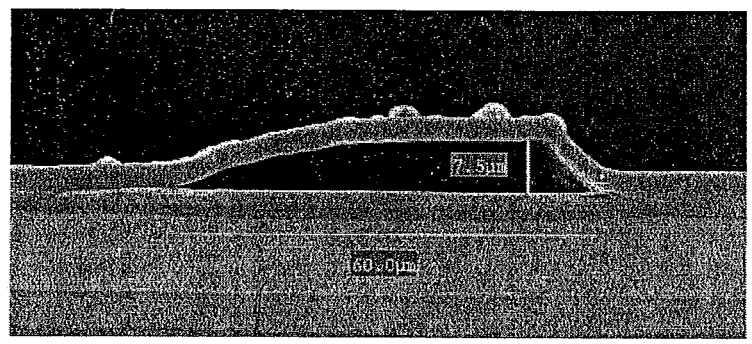
FIGS. 15A through 15D illustrates SEM images of the tapered microchannels.
Figure 15B:
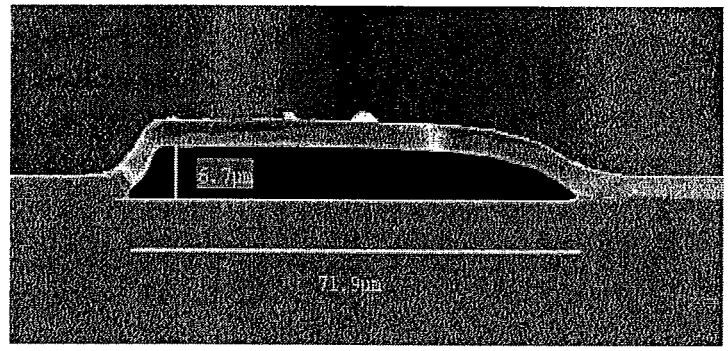
Figure 15C:
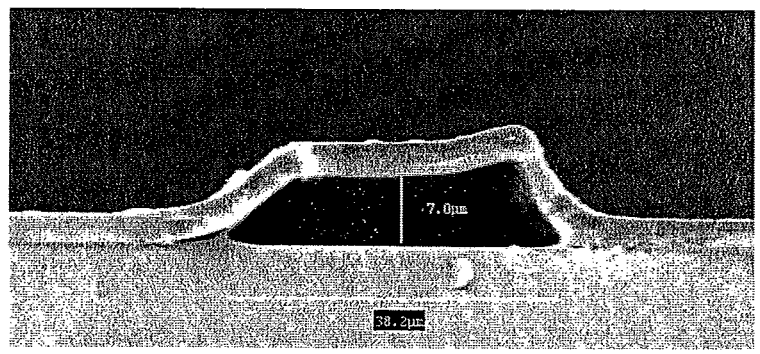
Figure 15D:
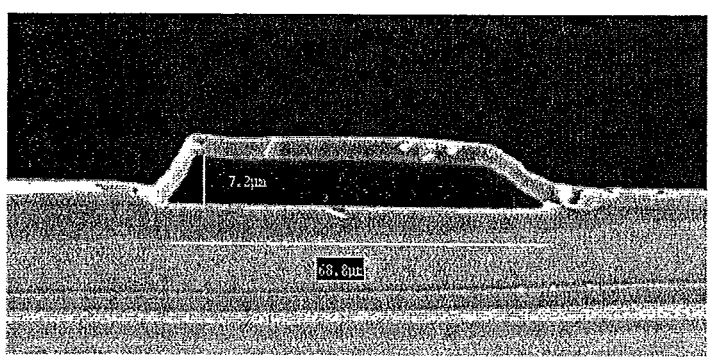

The tapered polymer microchannel patterns were next overcoated and decomposed in order to test the ability to transfer the tapered profile into the final microchannel. First, any polymer residue was removed from the substrate using an oxygen RIE plasma etch. The channel patterns were then encapsulated with $SiO_2$ using the same conditions described previously. The thermal decomposition of encapsulated channel patterns was performed under $N_2$ with a decomposition rate of 0.5%/minute. SEM images of the resulting tapered microchannels are shown in FIGS. 15A through 15D. Due to the ability to carefully control the decomposition rate of the polymer by controlling the heating profile during decomposition, no deformation was observed in the channel structure. This can be seen by comparing the profiles of the original PNB patterns in FIGS. 13 and 14 with the SEM channel cross sections in FIGS. 15A through 15D. The widths of the channels in FIGS. 15A through 15D are narrower than the feature sizes on the gray-scale mask due in part to slight RIE over-etching during the polymer residue removal step. Comparing FIGS. 15A through 15B with FIGS. 15C through 15D, it can be seen that a low contrast sacrificial material is desirable for the fabrication of smoothly tapered microchannel structures. The right hand side of FIGS. 15A through 15C, and left hand side of FIGS. 15B through 15D are non-gray scale features, for reference. As expected, the final shape of the channel structure is determined by a combination of the gray-scale pattern on the mask, the contrast of the photosensitive material, and the nominal exposure dose used in printing the feature.

Figure 16:
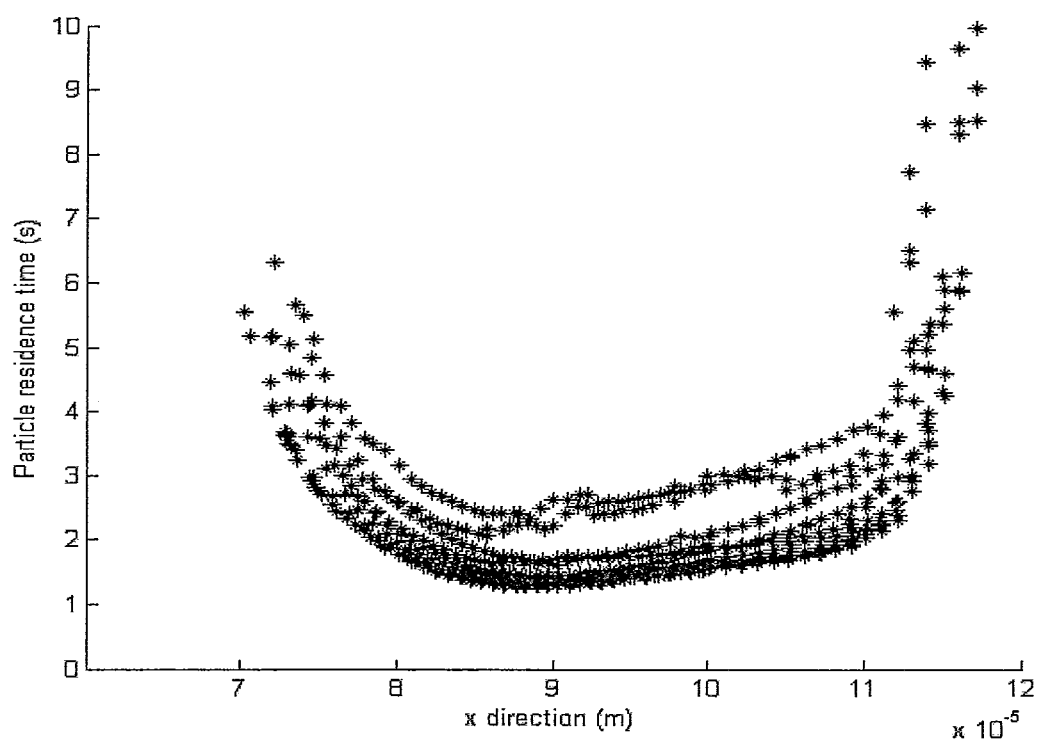
FIG. 16 illustrates the predicted transit times for flow around a microchannel corner using the boundary conditions and velocities used in the earlier idealized channel simulations.

In order to obtain an idea of the effectiveness of fabricated channel cross sections in reducing dispersion in flow around microchannel corners, the expected fluid transit times around a corner of the shape shown in FIG. 13 were simulated using FLUENT as described previously. FIG. 16 illustrates the predicted transit times for flow around this corner using the boundary conditions and velocities used in the earlier idealized channel simulations. It is clear from this simulation that even the crudely shaped channel fabricated for demonstration purposes in this work would be expected to perform better than the standard rectangular cross section channel. Further, it is hoped that by optimizing mask design and process conditions, that a more ideal shape similar to that shown in FIG. 5C can be achieved and used for device fabrication.

CONCLUSIONS

The fabrication of microchannels has been demonstrated by using photosensitive sacrificial polymer materials. The process consists of patterning the sacrificial polymer via photolithography, removal of polymer residue using RIE, encapsulation with a dielectric medium, and thermal decomposition of encapsulated polymer channel patterns. A method for designing heating programs to keep the thermal decomposition of sacrificial polymer at a constant rate was presented using the kinetic model of polymer decomposition. Heating programs designed using this approach have been demonstrated to prevent sudden and high decomposition rates (e.g., those which result in drastic release of gaseous decomposition products that distort channel features), and were also shown to produce microchannel patterns with well controlled shapes that do not exhibit any substantial deformation after the thermal decomposition of the sacrificial polymer. Controlling the decomposition rate and slowly releasing the gaseous decomposition products allows the decomposition products to permeate through the overcoat at a rate roughly equivalent to the decomposition rate, and thus avoids the build-up of high pressures in the microchannel which can lead to distortion and failure of the structure. It was also found that larger channels have a greater tendency toward distortion. A gray-scale lithographic process has been developed and demonstrated for the production of microchannels with tapered cross-sections. Such tapered channels have been shown through simulation to be able to reduce effects such as dispersion that are detrimental to microfluidic system performance.

It should be emphasized that the above-described embodiments of this disclosure are merely possible examples of implementations, and are set forth for a clear understanding of the principles of this disclosure. Many variations and modifications may be made to the above-described embodiments of this disclosure without departing substantially from the spirit and principles of this disclosure. All such modifications and variations are intended to be included herein within the scope of this disclosure and protected by the following claims.

What is claimed is:
1. A polymer composition, comprising:
a photodefinable polymer comprising a sacrificial polymer and a photoinitiator, the sacrificial polymer comprising an alkenyl-substituted polynorbornene,
wherein the photoinitiator is selected from, bis(2,4,6-trimethylbenzoyl)-phenylphosphineoxide, 2-benzyl-2-dimethylamino-1-(4-morpholinophenyl)-butanone-1, and combinations thereof.

2. A polymer composition, comprising:
a photodefinable polymer comprising a sacrificial polymer and a photoinitiator, the sacrificial polymer comprising an alkenyl-substituted polynorbornene,
wherein the sacrificial polymer is about 1 to 30% by weight of the photodefinable polymer, the photoinitiator is from about 0.5 to 5% by weight of the photodefinable polymer, and the polymer composition further comprises a solvent, wherein the solvent is about 65% to 99% by weight of the photodefinable polymer, and
wherein the photoinitiator is selected from, bis(2,4,6-trimethylbenzoyl)-phenylphosphineoxide, 2-benzyl-2-dimethylamino-1-(4-morpholinophenyl)-butanone-1, and combinations thereof.

3. The polymer composition of claim 2, wherein the photoinitiator is a free radical generator.

* * * * *